United States Patent
Lee et al.

(10) Patent No.: US 11,862,267 B2
(45) Date of Patent: *Jan. 2, 2024

(54) MULTI MODE MEMORY MODULE WITH DATA HANDLERS

(71) Applicant: Netlist, Inc., Irvine, CA (US)

(72) Inventors: Hyun Lee, Ladera Ranch, CA (US);
Jayesh R. Bhakta, Cerritos, CA (US);
Soonju Choi, Irvine, CA (US)

(73) Assignee: Netlist, Inc., Irvine, CA (US)

( * ) Notice: Subject to any disclaimer, the term of this patent is extended or adjusted under 35 U.S.C. 154(b) by 394 days.

This patent is subject to a terminal disclaimer.

(21) Appl. No.: 16/286,246

(22) Filed: Feb. 26, 2019

(65) Prior Publication Data

US 2019/0295675 A1    Sep. 26, 2019

Related U.S. Application Data

(63) Continuation of application No. 14/229,844, filed on Mar. 29, 2014, now Pat. No. 10,217,523, which is a
(Continued)

(51) Int. Cl.
*G11C 29/10* (2006.01)
*G11C 29/12* (2006.01)
*G11C 5/04* (2006.01)

(52) U.S. Cl.
CPC .............. *G11C 29/10* (2013.01); *G11C 29/12* (2013.01); *G11C 5/04* (2013.01)

(58) Field of Classification Search
None
See application file for complete search history.

(56) References Cited

U.S. PATENT DOCUMENTS

| 3,588,831 A | 6/1971 | Figueroa |
| 3,618,041 A | 11/1971 | Horikoshi |

(Continued)

OTHER PUBLICATIONS

Corrected Opening Brief of Appellant, Netlist, Inc., U.S. Court of Appeals Federal Circuit, Document 30, Jan. 10, 2019, 108 pgs.
(Continued)

*Primary Examiner* — April Y Blair
*Assistant Examiner* — Matthew W Wahlin
(74) *Attorney, Agent, or Firm* — USCH Law, PC

(57) ABSTRACT

A memory module is operable in a computer system to communicate data with a system memory controller via a system memory bus. The memory module comprises a plurality of memory devices mounted on a circuit board, a data module mounted on the circuit board and coupled between the plurality of memory devices and the system memory bus, and a control circuit mounted on the circuit board and coupled to the data module, the plurality of memory devices, and the system memory bus. The data module includes a plurality of data handlers in a plurality of integrated circuits. The memory module is operable in any of a plurality of modes, including a first mode and a second mode. The plurality of memory devices in the first mode is accessed by the system memory controller for normal memory read or write operations. The plurality of memory devices in the second mode communicate data signals with the data module while the memory module is not being accessed by the system memory controller for normal memory read or write operations.

24 Claims, 5 Drawing Sheets

Related U.S. Application Data continuation of application No. 13/745,790, filed on Jan. 19, 2013, now Pat. No. 8,689,064, which is a continuation of application No. 13/183,253, filed on Jul. 14, 2011, now Pat. No. 8,359,501, which is a continuation of application No. 12/422,925, filed on Apr. 13, 2009, now Pat. No. 8,001,434.

(60) Provisional application No. 61/044,825, filed on Apr. 14, 2008, provisional application No. 61/044,801, filed on Apr. 14, 2008, provisional application No. 61/044,839, filed on Apr. 14, 2008.

(56) References Cited

U.S. PATENT DOCUMENTS

| | | |
|---|---|---|
| 3,660,675 A | 5/1972 | Andrews, Jr. |
| 3,757,235 A | 9/1973 | McCormick et al. |
| 4,305,091 A | 12/1981 | Cooper |
| 4,586,168 A | 4/1986 | Adlhoch et al. |
| 4,637,020 A * | 1/1987 | Schinabeck ...... G01R 31/31935 714/724 |
| 4,701,845 A | 10/1987 | Andreasen et al. |
| 4,752,741 A | 6/1988 | Kim et al. |
| 4,782,487 A | 11/1988 | Smelser |
| 4,837,743 A | 6/1989 | Chiu et al. |
| 4,885,799 A | 12/1989 | Van Horn |
| 4,903,266 A | 2/1990 | Hack |
| 4,910,597 A | 3/1990 | Harada et al. |
| 4,942,556 A | 7/1990 | Sasaki et al. |
| 4,958,346 A | 9/1990 | Fujisaki |
| 4,987,321 A | 1/1991 | Toohey |
| 5,033,048 A | 7/1991 | Pierce et al. |
| 5,051,997 A | 9/1991 | Sakashita et al. |
| 5,138,619 A | 8/1992 | Fasang et al. |
| 5,173,906 A | 12/1992 | Dreibelbis et al. |
| 5,222,066 A | 6/1993 | Grula et al. |
| 5,241,503 A | 8/1993 | Cheng |
| 5,304,856 A | 4/1994 | Rainal |
| 5,337,254 A | 8/1994 | Knee et al. |
| 5,359,235 A | 10/1994 | Coyle et al. |
| 5,394,037 A | 2/1995 | Josephson et al. |
| 5,430,335 A | 7/1995 | Tanoi |
| 5,525,917 A | 6/1996 | Wong et al. |
| 5,655,113 A | 8/1997 | Leung et al. |
| 5,732,241 A | 3/1998 | Chan |
| 5,841,296 A | 11/1998 | Churcher et al. |
| 5,878,051 A | 3/1999 | Sharma et al. |
| 5,914,543 A | 6/1999 | Scherpenberg et al. |
| 5,936,900 A | 8/1999 | Hi et al. |
| 5,995,731 A | 11/1999 | Crouch et al. |
| 6,000,048 A | 12/1999 | Krishna et al. |
| 6,011,710 A | 1/2000 | Wiggers |
| 6,011,748 A * | 1/2000 | Lepejian ............... G11C 29/34 365/189.07 |
| 6,044,481 A | 3/2000 | Kornachuk et al. |
| 6,069,407 A | 5/2000 | Hamzehdoost |
| 6,070,217 A | 5/2000 | Connolly et al. |
| 6,108,798 A | 8/2000 | Heide et al. |
| 6,130,852 A | 10/2000 | Ohtani et al. |
| 6,169,696 B1 | 1/2001 | Bissey |
| 6,175,529 B1 | 1/2001 | Otsuka et al. |
| 6,178,126 B1 | 1/2001 | Kirihata et al. |
| 6,194,959 B1 | 2/2001 | Kamoshida et al. |
| 6,216,240 B1 | 4/2001 | Won et al. |
| 6,271,060 B1 | 8/2001 | Zandman et al. |
| 6,317,352 B1 | 11/2001 | Halbert et al. |
| 6,321,320 B1 | 11/2001 | Fleischman et al. |
| 6,333,873 B1 | 12/2001 | Kumanoya et al. |
| 6,396,136 B2 | 5/2002 | Kalidas et al. |
| 6,467,056 B1 | 10/2002 | Satou et al. |
| 6,541,872 B1 | 4/2003 | Schrock et al. |
| 6,560,740 B1 | 5/2003 | Zuraski, Jr. et al. |
| 6,614,702 B2 | 9/2003 | Lee |
| 6,639,820 B1 | 10/2003 | Khandekar et al. |
| 6,681,358 B1 | 1/2004 | Karimi et al. |
| 6,721,150 B1 | 4/2004 | Guerrero, Jr. et al. |
| 6,742,098 B1 * | 5/2004 | Halbert ............... G06F 13/4256 711/172 |
| 6,747,887 B2 | 6/2004 | Halbert et al. |
| 6,754,117 B2 | 6/2004 | Jeddeloh et al. |
| 6,812,869 B1 | 11/2004 | Rahman et al. |
| 6,829,728 B2 | 12/2004 | Cheng et al. |
| 6,832,303 B2 | 12/2004 | Tanaka |
| 6,910,162 B2 | 6/2005 | Co et al. |
| 6,918,072 B2 | 7/2005 | Cowles et al. |
| 6,928,024 B2 | 8/2005 | Pfeiffer et al. |
| 6,928,593 B1 | 8/2005 | Halbert et al. |
| 6,930,509 B2 | 8/2005 | Banik |
| 6,934,205 B1 | 8/2005 | Pandey et al. |
| 6,934,900 B1 | 8/2005 | Cheng et al. |
| 7,036,064 B1 | 4/2006 | Kebichi |
| 7,053,470 B1 | 5/2006 | Sellers et al. |
| 7,062,696 B2 | 6/2006 | Barry et al. |
| 7,093,066 B2 | 8/2006 | Klein |
| 7,168,005 B2 * | 1/2007 | Adams ................. G06F 11/2242 714/31 |
| 7,177,211 B2 | 2/2007 | Zimmerman et al. |
| 7,181,659 B2 | 2/2007 | Bravo et al. |
| 7,184,915 B2 | 2/2007 | Hansquine et al. |
| 7,190,210 B2 | 3/2007 | Azrai et al. |
| 7,203,873 B1 | 4/2007 | Adams |
| 7,210,059 B2 | 4/2007 | Jeddeloh |
| 7,253,652 B2 | 8/2007 | Azimi et al. |
| 7,284,166 B2 | 10/2007 | Zappa et al. |
| 7,310,752 B2 | 12/2007 | Jeddeloh et al. |
| 7,343,458 B2 | 3/2008 | Vogt et al. |
| 7,379,316 B2 | 5/2008 | Rajan |
| 7,392,442 B2 | 6/2008 | Averbuj et al. |
| 7,464,225 B2 | 12/2008 | Tsern |
| 7,562,271 B2 | 7/2009 | Shaeffer et al. |
| 7,631,153 B2 | 12/2009 | Mahrla et al. |
| 7,774,667 B2 | 8/2010 | Saito et al. |
| 7,865,674 B2 | 1/2011 | Gower et al. |
| 7,957,218 B2 | 6/2011 | Welker |
| 7,965,530 B2 | 6/2011 | Han et al. |
| 8,089,795 B2 | 1/2012 | Rajan et al. |
| 8,154,901 B1 | 4/2012 | Lee et al. |
| 8,189,328 B2 | 5/2012 | Kanapathippillai et al. |
| 8,233,303 B2 | 7/2012 | Best et al. |
| 8,250,295 B2 | 8/2012 | Amidi et al. |
| 10,489,314 B2 * | 11/2019 | Solomon ............... G11C 7/1072 |
| 2001/0008006 A1 | 7/2001 | Klein |
| 2001/0048342 A1 | 12/2001 | Yoshida et al. |
| 2002/0000847 A1 | 1/2002 | Taguchi |
| 2002/0131535 A1 | 9/2002 | Huber et al. |
| 2002/0140523 A1 | 10/2002 | Park et al. |
| 2003/0098742 A1 | 5/2003 | Nakagawa et al. |
| 2003/0126346 A1 | 7/2003 | Kuo |
| 2003/0197797 A1 | 10/2003 | Segura |
| 2003/0218491 A1 | 11/2003 | Nagasue |
| 2004/0000708 A1 | 1/2004 | Rapport et al. |
| 2004/0006729 A1 | 1/2004 | Pendurkar |
| 2004/0155702 A1 | 8/2004 | Danielsson |
| 2004/0199843 A1 | 10/2004 | Hansquine et al. |
| 2005/0093620 A1 | 5/2005 | Ho et al. |
| 2005/0127989 A1 | 6/2005 | Miyagi |
| 2005/0257109 A1 * | 11/2005 | Averbuj ............... G11C 29/16 714/718 |
| 2005/0289423 A1 | 12/2005 | Yabuta |
| 2006/0082383 A1 | 4/2006 | Choi |
| 2006/0095817 A1 | 5/2006 | Lee et al. |
| 2006/0107156 A1 | 5/2006 | Lee et al. |
| 2006/0140015 A1 | 6/2006 | Kasamsetty |
| 2006/0144015 A1 | 7/2006 | Cash, III et al. |
| 2006/0147217 A1 | 7/2006 | Hahin et al. |
| 2006/0192653 A1 | 8/2006 | Atkinson et al. |
| 2006/0242458 A1 | 10/2006 | Feldman et al. |
| 2006/0262586 A1 | 11/2006 | Solomon et al. |
| 2006/0271748 A1 | 11/2006 | Jain et al. |
| 2006/0002773 A1 | 12/2006 | Ellsberry et al. |
| 2007/0030814 A1 | 2/2007 | Shin et al. |
| 2007/0058471 A1 | 3/2007 | Rajan et al. |

(56) References Cited

U.S. PATENT DOCUMENTS

| | | | |
|---|---|---|---|
| 2007/0070669 A1* | 3/2007 | Tsern | G11C 5/063 365/51 |
| 2007/0079199 A1 | 4/2007 | Chorn et al. | |
| 2007/0109707 A1 | 5/2007 | Honda | |
| 2007/0152743 A1 | 7/2007 | Keeth et al. | |
| 2007/0204075 A1* | 8/2007 | Rajan | G11C 11/4093 710/22 |
| 2007/0223296 A1 | 9/2007 | Miller et al. | |
| 2007/0297397 A1* | 12/2007 | Coteus | G06F 13/1684 370/360 |
| 2008/0104352 A1* | 5/2008 | Talbot | G06F 13/1673 711/167 |
| 2008/0162790 A1 | 7/2008 | Im | |
| 2009/0103387 A1 | 4/2009 | Shau | |

OTHER PUBLICATIONS

Response Brief of Appellees, SK Hynix, Netlist, Inc., U.S. Court of Appeals Federal Circuit, Document 39, Jul. 1, 2019, 87 pgs.
Hynix Response Brief, Netlist, Inc., U.S. Court of Appeals Federal Circuit, Document 43, Apr. 19, 2019, 79 pgs.
Reply Brief of Appellant, Netlist, Inc., U.S. Court of Appeals Federal Circuit, Document 43, Aug. 5, 2019, 48 pgs.
Reply Brief of Appellant, Netlist, Inc., U.S. Court of Appeals Federal Circuit, Document 50, Jun. 3, 2019, 47 pgs.
Brief of Appellant, Netlist, Inc., U.S. Court of Appeals Federal Circuit, Document 26, Mar. 8, 2019, 236 pgs.
Petition for Inter Partes Review filed on Jun. 24, 2014 for U.S. Pat. No. 8,516,185, IPR Case No. IPR2014-01029, and all associated documents including cited references and expert declarations.
Petition for Inter Partes Review filed on Jun. 22, 2014 for U.S. Pat. No. 7,881,150, IPR Case No. IPR2014-00882 and IPR Case No. IPR2014-01011, and all associated documents including cited references and expert declarations.
Petition for Inter Partes Review filed on Jun. 24, 2014 for U.S. Pat. No. 8,081,536, IPR Case No. IPR2014-00883, and all associated documents including cited references and expert declarations.
Petition for Inter Partes Review filed on Jun. 24, 2014 for U.S. Pat. No. 8,001,434, IPR Case No. IPR2014-00970, and all associated documents including cited references and expert declarations.
Petition for Inter Partes Review filed on Jun. 24, 2014 for U.S. Pat. No. 8,359,501, IPR Case No. IPR2014-00971, and all associated documents including cited references and expert declarations.
Altera, ACEX iK, Programmable Logic Device Family, Data Sheet, May 2003, Ver 3.4.
Horowitz, "The Art of Electronics," Cambridge Univ. Press, 1989, selected pages.
Huang et al., "An Efficient Parallel Transparent BIST Method for Multiple Embedded Memory Buffers," VLSI Design 2011, p. 379.
Jacob, Bruce L.; "Synchronous DRAM Architectures, Organizations, and Alternative Technologies". University of Maryland, Dec. 10, 2002.
JEDEC Standard No. 21-C Section 4.5.7, 168 Pin Registered SDRAM DIMM Family, Release 7.
JEDEC 21-C, Section 4.6.1, 278 Pin Buffered SDRAM DIMM Family.
JEDEC Standard No. 21-C Section 4.1.2.5, Appendix E, "Specific PD's for Synchronous DRAM (SDRAM)," pp. 1-25.
JEDEC Standard, "Fully Buffered DIMM (FBDIMM): DFx Design for Validation and Test," JESD82-28, Feb. 2008.
Reese, "Introduction to Logic Synthesis using Verilog HDL," Morgan&Claypool Publishers, 2006, pp. 1-28.
PC2100 and PC1600 DDR SDRAM Registered DIM M Design Specification JEDEC, Standard No. 21-C, Revision 1.3, Jan. 2002, pp. 4.20.4-1.
Inter Partes Review Case No. IPR2014-00970, Petition for Inter Partes Review of U.S. Pat. No. 8,001,434, filed on Jun. 18, 2014.
Inter Partes Review Case No. IPR2014-00970, Exhibit 1007 to Petition for Inter Partes Review, "Declaration of Donald Albert, Ph.D," filed on Jun. 18, 2014.
Inter Partes Review Case No. IPR2014-00970, Exhibit 2002 to Petition for Inter Partes Review, "Excerpt from Merriam-Webster's Collegiate Dictionary," filed on Jun. 18, 2014.
Inter Partes Review Case No. IPR2014-00970, Exhibit 2003 to Petition for Inter Partes Review, "Excerpt from Webster Handy College Dictionary," filed on Jun. 18, 2014.
Inter Partes Review Case No. IPR2014-00970, Patent Owner's Preliminary Response pursuant to 37 C.F.R. § 42.107, filed on Sep. 24, 2014.
Inter Partes Review Case No. IPR2014-00970, Decision—Institution of Inter Partes Review, issued on Dec. 16, 2014.
Inter Partes Review Case No. IPR2014-00971, Petition for Inter Partes Review for U.S. Pat. No. 8,359,501, filed on Jun. 18, 2014.
Inter Partes Review Case No. IPR2014-00971, Exhibit 1007 to Petition for Inter Partes Review, "Declaration of Donald Albert, Ph.D," filed on Jun. 18, 2014.
Inter Partes Review Case No. IPR2014-00971, Patent Owner's Preliminary Response pursuant to 37 C.F.R. § 42.107, filed on Sep. 24, 2014.
Inter Partes Review Case No. IPR2014-00971, Decision—Institution of Inter Partes Review, issued on Dec. 16, 2014.
Inter Partes Review Case No. IPR2014-01373, Petition for Inter Partes Review of U.S. Pat. No. 8,001,434, filed on Aug. 25, 2014.
Inter Partes Review Case No. IPR2014-01373, Exhibit 1002 to Petition for Inter Partes Review, U.S. Pat. No. 8,001,434, "Declaration of Dr. Nader Bagherzadeh, Ph.D. under 37 C.F.R. § 1.68," filed on Aug. 23, 2014.
"IEEE Standard Test Access Port and Boundary-Scan Architecture" ("JTAG 2001", IEEE-SA Standards Board, IEEE Std1149.1-2001, Jun. 14, 2001.
Inter Partes Review Case No. IPR2014-01373, Exhibit 2001 to Petition for Inter Partes Review, U.S. Pat. No. 8,001,434, "Webster's II New College Dictionary," filed on Aug. 23, 2014.
Inter Partes Review Case No. IPR2014-01373, Exhibit 2002 to Petition for Inter Partes Review, U.S. Pat. No. 8,001,434, "IEEE Standard Dictionary of Electrical and Electronics Terms," filed on Aug. 22, 2014.
Inter Partes Review Case No. IPR2014-01373, Exhibit 2003 to Petition for Inter Partes Review, U.S. Pat. No. 8,001,434, "JEDEC Standard, Fully Buffered DIMM (FBDIMM) DFx Design for Validation and Test," filed on Aug. 22, 2014.
Inter Partes Review Case No. IPR2014-01372, Petition for Inter Partes Review of Claims 1-35 of U.S. Pat. No. 8,001,434, filed on Aug. 23, 2014.
Inter Partes Review Case No. IPR2014-01372, Exhibit 1002 to Petition for Inter Partes Review, U.S. Pat. No. 8,001,434, "Declaration of Dr. Nader Bagherzadeh, Ph.D. under 37 C.F.R. § 1.68," filed on Aug. 23, 2014.
Inter Partes Review Case No. IPR2014-01374, Petition for Inter Partes Review of Claims 1-35 of U.S. Pat. No. 8,001,434, filed on Aug. 23, 2014.
Inter Partes Review Case No. IPR2014-01374, Exhibit 1002 to Petition for Inter Partes Review, U.S. Pat. No. 8,001,434, "Declaration of Dr. Nader Bagherzadeh, Ph.D. under 37 C.F.R. § 1.68," filed on Aug. 23, 2014.
Inter Partes Review Case No. IPR2014-01375, Petition for Inter Partes Review of Claims 1-35 of U.S. Pat. No. 8,001,434, filed on Aug. 23, 2014.
Inter Partes Review Case No. IPR2014-01375, Exhibit 1002 to Petition for Inter Partes Review, U.S. Pat. No. 8,001,434, "Declaration of Dr. Nader Bagherzadeh, Ph.D. under 37 C.F.R. § 1.68," filed on Aug. 23, 2014.
Inter Partes Review Case No. IPR2014-01029, Petition for Inter Partes Review of U.S. Pat. No. 8,516,185, filed on Jun. 24, 2014.
Inter Partes Review Case No. IPR2014-01029, Exhibit 1008 to Petition for Inter Partes Review, "Declaration of Charles J. Neuhauser, Ph.D. under 37 C.F.R. § 1.68," filed on Jun. 24, 2014.
Inter Partes Review Case No. IPR2014-01029, Supplemental Petition for Inter Partes Review of U.S. Pat. No. 8,516,185, filed on Jul. 23, 2014.

(56) References Cited

OTHER PUBLICATIONS

Inter Partes Review Case No. IPR2014-01029, Patent Owner's Preliminary Response pursuant to 37 C.F.R. § 42.107, filed on Oct. 17, 2014.
Inter Partes Review Case No. IPR2014-01029, Decision Denying Institution of Inter Partes Review 37 C.F.R. § 42.108, issued Dec. 16, 2014.
Inter Partes Review Case No. IPR2014-01369, Corrected Petition for Inter Partes Review of Claims 1-19 of U.S. Pat. No. 8,516,185, filed on Sep. 22, 2014.
Inter Partes Review Case No. IPR2014-01369, Exhibit 1008 to Corrected Petition for Inter Partes Review, "Declaration of Dr. Nader Bagherzadeh under 37 C.F.R. § 1.68," filed on Sep. 22, 2014.
Inter Partes Review Case No. IPR2014-01369, Exhibit 1013 to Corrected Petition for Inter Partes Review, "Webster's II New College Dictionary," filed on Sep. 22, 2014.
Inter Partes Review Case No. IPR2014-01369, Exhibit 1014 to Corrected Petition for Inter Partes Review, "Standard Dictionary of Electrical and Electronics Terms," IEEE 1988, filed on Sep. 22, 2014.
Inter Partes Review Case No. IPR2014-00882, Corrected Petition for Inter Partes Review of U.S. Pat. No. 7,881,150, filed on Jul. 8, 2014.
Inter Partes Review Case No. IPR2014-00882, Exhibit 1007 to Petition for Inter Partes Review, "Declaration of Dr. Srinivasan Jagannathan," filed on Jun. 22, 2014.
Inter Partes Review Case No. IPR2014-00883, Corrected Petition for Inter Partes Review of U.S. Pat. No. 8,081,536, filed on Jul. 8, 2014.
Inter Partes Review Case No. IPR2014-00883, Exhibit 1011 to Petition for Inter Partes Review, "Declaration of Dr. Srinivasan Jagannathan," filed on Jun. 21, 2014.
Inter Partes Review Case No. IPR2014-01011, Corrected Petition for Inter Partes Review of U.S. Pat. No. 7,881,150, filed on Jul. 8, 2014.
Inter Partes Review Case No. IPR2014-01011, Exhibit 1007 to Petition for Inter Partes Review, "Declaration of Dr. Srinivasan Jagannathan." filed on Jun. 22, 2014.
McCluskey, Edward J., *Logic Design Principles with Emphasis on Testable Semicustom Circuits*, Prentice Hall, 1986, pp. 104-107 and 119-120.
U.S. District Court Northern District of California, Case No. 4:13-CV-05889-YGR, *Netlist, Inc.* v. *Smart Storage Systems, Inc., and Diablo Technologies, Inc.*, Smart Storage Systems, Inc.'s Invalidity Contentions, dated Jun. 6, 2014.
U.S. District Court Northern District of California, Case No. 4:13-CV-05889-YGR, *Netlist, Inc.* v. *Smart Storage Systems, Inc., and Diablo Technologies, Inc.* Exhibits A.1-A.10 to "Smart Storage Systems, Inc.'s Invalidity Contentions," dated Jun. 6, 2014.
U.S. District Court Northern District of California, Case No. 4:13-CV-05889-YGR, *Netlist, Inc.* v. *Smart Storage Systems, Inc., and Diablo Technologies, Inc.* Exhibits B.1-6.8 to "Smart Storage Systems, Inc.'s Invalidity Contentions," dated Jun. 6, 2014.
U.S. District Court Northern District of California, Case No. 4:13-CV-05889-YGR, *Netlist, Inc.* v. *Smart Storage Systems, Inc., and Diablo Technologies, Inc.* Exhibits E.1-E.7 to "Smart Storage Systems, Inc.'s Invalidity Contentions," dated Jun. 6, 2014.
U.S. District Court Northern District of California, Case No. 4:13-CV-05889-YGR, *Netlist, Inc.* v. *Smart Storage Systems, Inc., and Diablo Technologies, Inc.* Exhibits F.1-F.5 to "Smart Storage Systems, Inc.'s Invalidity Contentions," dated Jun. 6, 2014.
U.S. District Court Northern District of California, Case No. 4:13-CV-05889-YGR, *Netlist, Inc.* v. *Smart Storage Systems, Inc., and Diablo Technologies, Inc.* Exhibits G.1-G.6 to "Smart Storage Systems, Inc.'s Invalidity Contentions," dated Jun. 6, 2014.
U.S. District Court Northern District of California, Case No. 4:13-CV-05889-YGR, *Netlist, Inc.* v. *Smart Storage Systems, Inc., and Diablo Technologies, Inc.* Exhibit H to "Smart Storage Systems, Inc.'s Invalidity Contentions," dated Jun. 6, 2014.

U.S. District Court Northern District of California, Case No. 4:13-CV-05889-YGR, *Netlist, Inc.* v. *Smart Storage Systems, Inc., and Diablo Technologies, Inc.* Diablo Technologies, Inc.'s Invalidity Contentions, dated Jun. 6, 2014.
U.S. District Court Northern District of California, Case No. 4:13-CV-05889-YGR, *Netlist, Inc.* v. *Smart Storage Systems, Inc., and Diablo Technologies, Inc.* Exhibits A-1 to A-10 to "Diablo Technologies, Inc.'s Invalidity Contentions," dated Jun. 6, 2014.
U.S. District Court Northern District of California, Case No. 4:13-CV-05889-YGR, *Netlist, Inc.* v. *Smart Storage Systems, Inc., and Diablo Technologies, Inc.*, Exhibits C-1 to C-7 to "Diablo Technologies, Inc.'s Invalidity Contentions," dated Jun. 6, 2014.
U.S. District Court Northern District of California, Case No. 4:13-CV-05889-YGR, *Netlist, Inc.* v. *Smart Storage Systems, Inc., and Diablo Technologies, Inc.*, Exhibits D-1 to D-6 to "Diablo Technologies, Inc.'s Invalidity Contentions," dated Jun. 6, 2014.
U.S. District Court Northern District of California, Case No. 4:13-CV-05889-YGR, *Netlist, Inc.* v. *Smart Storage Systems, Inc., and Diablo Technologies, Inc.*, Exhibits F-1 to F-5 to "Diablo Technologies, Inc.'s Invalidity Contentions," dated Jun. 6, 2014.
U.S. District Court Northern District of California, Case No. 4:13-CV-05889-YGR, *Netlist, Inc.* v. *Smart Storage Systems, Inc., and Diablo Technologies, Inc.*, Exhibits G-1 to G-6 to "Diablo Technologies, Inc.'s Invalidity Contentions," dated Jun. 6, 2014.
U.S. District Court Northern District of California, Case No. 4:13-CV-05889-YGR, *Netlist, Inc.* v. *Smart Storage Systems, Inc., and Diablo Technologies, Inc.*, Exhibit H to "Diablo Technologies, Inc.'s Invalidity Contentions," dated Jun. 6, 2014.
Bayard "On the LTI properties of adaptive feed forward systems with tap delay-line regressors", IEEE Transactions on Signal Processing, May 1999, vol. 47, Issue 5, pp. 1288-1296.
Der-Chang et al. "A parallel built-in self-diagnostic method for embedded memory arrays", IEEE Transactions on Computer-Aided Design of Integrated Circuits and Systems, Apr. 2002, vol. 21, Issue 4, pp. 449-465.
Mutoh et al. "EMI Noise controlling methods suitable for electric vehicle drive systems", Industrial Electronics Society, 2004, IECON 2004, Nov. 2-6, 2004, vol. 1, pp. 963-968.
Sekiguchi et al. "Low-noise, high-speed data transmission using a ringing-canceling output buffer", IEEE Journal of Solid-State Circuits, Dec. 1995, vol. 30, Issue 12, pp. 1569-1574.
JEDEC Global Standards for the Microelectronics Industry, Standards http://www.jedec.org/standards-documents/about-JEDEC-standards (2014).
Inter Partes Review Case No. IPR2014-00970, Patent Owner's Response pursuant to 37 C.F.R. § 42.120, filed Mar. 17, 2015.
Inter Partes Review Case No. IPR2014-00970, Petitioner's Reply to Patent Owner Response, Jun. 8, 2015.
Inter Partes Review Case No. IPR2014-00970, Patent Owner's Request for Oral Argument, filed Jul. 2, 2015.
Inter Partes Review Case No. IPR2014-00970, Patent Owner's Motion for Observation re Cross-Examination of Dr. Donald Alpert, filed Jul. 2, 2015.
Inter Partes Review Case No. IPR2014-00970, Patent Owner's Second Amended Exhibit List, filed Jul. 2, 2015.
Inter Partes Review Case No. IPR2014-00970, Petitioner's Request for Oral Argument, filed Jul. 2, 2015.
Inter Partes Review Case No. IPR2014-00970, Order: Request for Oral Argument, issued Jul. 7, 2015.
Inter Partes Review Case No. IPR2014-00970, Petitioner Response to Netlist's Motion for Observations on Cross-Examination, filed Jul. 13, 2015.
Inter Partes Review Case No. IPR2014-00970, Record of Oral Hearing, issued Aug. 24, 2015.
Inter Partes Review Case No. IPR2014-00970, Final Written Decision—35 USC 318 and 37 CFR 42.73, issued Dec. 14, 2015.
Inter Partes Review Case No. IPR2014-00970, Petitioner's Request for Rehearing, filed Jan. 13, 2016.
Inter Partes Review Case No. IPR2014-00970, Exhibit 1009 to Petitioner's Reply to Patent Owner Response, "Declaration of Donald Alpert PhD," filed Jun. 8, 2015.

(56) References Cited

OTHER PUBLICATIONS

Inter Partes Review Case No. IPR2014-00970, Exhibit 1010 to Petitioner's Reply to Patent Owner Response, "Deposition Transcript of Dr. Carl Sechen," filed Jun. 8, 2015.
Inter Partes Review Case No. IPR2014-00970, Exhibit 1011 to Petitioner's Reply to Patent Owner Response, "American Heritage Dictionary," filed Jun. 8, 2015.
Inter Partes Review Case No. IPR2014-00970, Exhibit 1012 to Petitioner's Reply to Patent Owner Response, "Webster's Encyclopedic Unabridged Dictionary," filed Jun. 8, 2015.
Inter Partes Review Case No. IPR2014-00970, Exhibit 1013 to Petitioner's Reply to Patent Owner Response, "IEEE Standard 1450," filed Jun. 8, 2015.
Inter Partes Review Case No. IPR2014-00970, Exhibit 2004 to Patent Owner's Response pursuant to 37 C.F.R. § 42.120, "Defendants' Proposed Preliminary Claim Constructions and Extrinsic Evidence, Case No. 13-cv-05889-YGR Jul. 28, 2014," filed Mar. 17, 2015.
Inter Partes Review Case No. IPR2014-00970, Exhibit 2005 to Patent Owner's Response pursuant to 37 C.F.R. § 42.120, "Enlarged Figure 3 from Exhibit 1004," filed Mar. 17, 2015.
Inter Partes Review Case No. IPR2014-00970, Exhibit 2006 to Patent Owner's Response pursuant to 37 C.F.R. § 42.120, Enlarged Figure 3 from Exhibit 1004 to Petition for Inter Partes Review of U.S. Pat. No. 8,001,434, filed on Jun. 18, 2014, Huang et al, "An Efficient Parallel Transparent BIST Method for Multiple Embedded Memory Buffers," VLSI Design 2011, p. 379,—filed Mar. 17, 2015.
Inter Partes Review Case No. IPR2014-00970, Exhibit 2007 to Patent Owner's Response pursuant to 37 C.F.R. § 42.120, "Color p. 35 to Patent Owner's Preliminary Response filed Sep. 24, 2014," filed Mar. 17, 2015.
Inter Partes Review Case No. IPR2014-00970, Exhibit 2008 to Patent Owner's Response pursuant to 37 C.F.R. § 42.120, "Color p. 38 to Patent Owner's Preliminary Response filed Sep. 24, 2014," filed Mar. 17, 2015.
Inter Partes Review Case No. IPR2014-00970, Exhibit 2009 to Patent Owner's Response pursuant to 37 C.F.R. § 42.120, "Excerpts from American Heritage Dictionary," filed Mar. 17, 2015.
Inter Partes Review Case No. IPR2014-00970, Exhibit 2010 to Patent Owner's Response pursuant to 37 C.F.R. § 42.120, "Excerpts from Webster's Third New International Dictionary," filed Mar. 17, 2015.
Inter Partes Review Case No. IPR2014-00970, Exhibit 2011 to Patent Owner's Response pursuant to 37 C.F.R. § 42.120, "Excerpts from New Riverside University Dictionary," filed Mar. 17, 2015.
Inter Partes Review Case No. IPR2014-00970, Exhibit 2012 to Patent Owner's Response pursuant to 37 C.F.R. § 42.120, "Declaration of Carl Sechen, Ph.D.," filed Mar. 17, 2015.
Inter Partes Review Case No. IPR2014-00970, Exhibit 2013 to Patent Owner's Response pursuant to 37 C.F.R. § 42.120, "Cross-Examination transcript of Donald Alpert, Ph.D., taken Feb. 12, 2015," filed Mar. 17, 2015.
Inter Partes Review Case No. IPR2014-00970, Exhibit 2014 to Patent Owner's Response pursuant to 37 C.F.R. § 42.120, "Excerpts from Design of High-Performance Microprocessor Circuits," filed Mar. 17, 2015.
Inter Partes Review Case No. IPR2014-00970, Exhibit 2015 to Patent Owner's Response pursuant to 37 C.F.R. § 42.120, "Excerpts from Logic and Computer Design Fundamentals," filed Mar. 17, 2015.
Inter Partes Review Case No. IPR2014-00970, Exhibit 2016 to Patent Owner's Response pursuant to 37 C.F.R. § 42.120, "Excerpts from Digital Design, Principles an Practices," filed Mar. 17, 2015.
Inter Partes Review Case No. IPR2014-00970, Exhibit 2017 to Patent Owner's Response pursuant to 37 C.F.R. § 42.120, "Excerpts from Digital Logic with Verilog Design," filed Mar. 17, 2015.
Inter Partes Review Case No. IPR2014-00970, Exhibit 2018 to Patent Owner's Response pursuant to 37 C.F.R. § 42.120, "Decision on Institution of IPR for U.S. Pat. No. 8,001,434 (IPR2014-01372)," filed Mar. 17, 2015.

Inter Partes Review Case No. IPR2014-00970, Exhibit 2019 to Patent Owner's Response pursuant to 37 C.F.R. § 42.120, "Recent Advances in BIST," filed Mar. 17, 2015.
Inter Partes Review Case No. IPR2014-00970, Exhibit 2020 to Patent Owner's Response pursuant to 37 C.F.R. § 42.120, "Decision on Institution of IPR for U.S. Pat. No. 8,359,501 (IPR2014-01375)," filed Mar. 17, 2015.
Inter Partes Review Case No. IPR2014-00970, Exhibit 2021 to Patent Owner's Response pursuant to 37 C.F.R. § 42.120, "Cross-Examination transcript of Dr. Alpert, Jun. 24, 2015," filed Mar. 17, 2015.
Inter Partes Review Case No. IPR2014-00971, Patent Owner's Response, filed Mar. 17, 2015.
Inter Partes Review Case No. IPR2014-00971, Patent Owner's First Amended Exhibit List, filed Mar. 18, 2015.
Inter Partes Review Case No. IPR2014-00971, Motion to File Corrected Patent Owner Response, filed Apr. 15, 2015.
Inter Partes Review Case No. IPR2014-00971, Corrected Patent Owner Response, filed Apr. 15, 2015.
Inter Partes Review Case No. IPR2014-00971, Petitioner's Reply to Patent Owner Response, filed Jun. 8, 2015.
Inter Partes Review Case No. IPR2014-00971, Patent Owner's Request for Oral Argument, filed Jul. 2, 2015.
Inter Partes Review Case No. IPR2014-00971, Patent Owner's Motion for Observation re Cross-Examination of Dr. Donald Alpert, filed Jul. 2, 2015.
Inter Partes Review Case No. IPR2014-00971, Petitioner Request for Oral Argument, filed Jul. 2, 2015.
Inter Partes Review Case No. IPR2014-00971, Order Request for Oral Argument, filed Jul. 7, 2015.
Inter Partes Review Case No. IPR2014-00971, Petitioner Response to Netlist's Motion for Observations on Cross-Examination, filed Jul. 13, 2015.
Inter Partes Review Case No. IPR2014-00971, Record of Oral Hearing, filed Aug. 24, 2015.
Inter Partes Review Case No. IPR2014-00971, Final Written Decision—35 USC 318 and 37 CFR 42.73, filed Dec. 14, 2015.
Inter Partes Review Case No. IPR2014-00971, Petitioner's Request for Rehearing, filed Jan. 13, 2016.
Inter Partes Review Case No. IPR2014-00971, Exhibit 1009, 'Declaration of Donald Alpert PhD,' filed Jun. 8, 2015.
Inter Partes Review Case No. IPR2014-01372, Related Matters, filed Sep. 12, 2014.
Inter Partes Review Case No. IPR2014-01372, Corrected Petition For Inter Partes Review, filed Sep. 22, 2014.
Inter Partes Review Case No. IPR2014-01372, Patent Owner's Preliminary Response, filed Dec. 18, 2014.
Inter Partes Review Case No. IPR2014-01372, Patent Owner's Exhibit List, filed Dec. 18, 2014.
Inter Partes Review Case No. IPR2014-01372, Decision—Institution of Inter Partes Review 37 C.F.R. 42.108, filed Mar. 10, 2015.
Inter Partes Review Case No. IPR2014-01372, Patent Owner's Response, filed Jun. 15, 2015.
Inter Partes Review Case No. IPR2014-01372, Petitioners Reply To POs Response, filed Sep. 10, 2015.
Inter Partes Review Case No. IPR2014-01372, Patent Owner's Objections to Evidence Filed With Petitioner Reply, filed Sep. 17, 2015.
Inter Partes Review Case No. IPR2014-01372, Petitioner SMART Request For Oral Argument, filed Sep. 24, 2015.
Inter Partes Review Case No. IPR2014-01372, Order—Trial Hearing—37 CFR 42.70, filed Oct. 8, 2015.
Inter Partes Review Case No. IPR2014-01372, Patent Owner's Request for Oral Argument, filed Oct. 16, 2015.
Inter Partes Review Case No. IPR2014-01372, Patent Owner Motion to Exclude, filed Oct. 16, 2015.
Inter Partes Review Case No. IPR2014-01372, Motion to Exclude Portions of Petitioner's Reply to Patent Owner's Response, filed Oct. 19, 2015.
Inter Partes Review Case No. IPR2014-01372, Patent Owner's Opposition to Petitioner's Motion to Exclude, filed Oct. 26, 2015.

(56) References Cited

OTHER PUBLICATIONS

Inter Partes Review Case No. IPR2014-01372, Patent Owner's Fourth Amended Exhibit List, filed Oct. 26, 2015.
Inter Partes Review Case No. IPR2014-01372, IPR2014-01372 SMART Response—PO Motion To Exclude Exhibits, filed Oct. 26, 2015.
Inter Partes Review Case No. IPR2014-01372, IPR2014-01372 Smart Response—PO Motion To Exclude Reply Portions, filed Oct. 26, 2015.
Inter Partes Review Case No. IPR2014-01372, Reply In Support of Patent Owner Motion to Exclude, filed Nov. 2, 2015.
Inter Partes Review Case No. IPR2014-01372, SMART Reply in Support of Motion to Exclude, filed Nov. 2, 2015.
Inter Partes Review Case No. IPR2014-01372, Record of Oral Hearing, filed Dec. 18, 2015.
Inter Partes Review Case No. IPR2014-01372, Ex 1026—Websters New Collegiate, filed Sep. 10, 2015.
Inter Partes Review Case No. IPR2014-01372, Ex 1027—May 2015 Dolin Article, filed Sep. 10, 2015.
Inter Partes Review Case No. IPR2014-01372, Ex 1028—Portola Packaging Reexam Guidance, filed Sep. 10, 2015.
Inter Partes Review Case No. IPR2014-01372, Ex 1029—Staunstrup Textbook Re Self Timed Signalling, filed Sep. 10, 2015.
Inter Partes Review Case No. IPR2014-01372, Ex 1030—DIC Rabaey Textbook, filed Sep. 10, 2015.
Inter Partes Review Case No. IPR2014-01372, Ex 1031—Dp Tr Dr Carl Sechen, filed Sep. 10, 2015.
Inter Partes Review Case No. IPR2014-01372, Ex 1032—Websters II Dict, filed Sep. 10, 2015.
Inter Partes Review Case No. IPR2014-01372, Ex 1033—McGraw Hill Electronics Dict, filed Sep. 10, 2015.
Inter Partes Review Case No. IPR2014-01372, Ex 1034—IEEE Dict, filed Sep. 10, 2015.
Inter Partes Review Case No. IPR2014-01372, Exhibit 2009, 'Excerpts from Merriam Webster's Collegiate Dictionary, Tenth Edition (2001),' filed Dec. 18, 2014.
Inter Partes Review Case No. IPR2014-01372, Exhibit 2010, 'Excerpts from the American Webster Hand College Dictionary (1981),' filed Dec. 18, 2014.
Inter Partes Review Case No. IPR2014-01372, Exhibit 2011, 'Excerpts from Merriam Webster's Collegiate Dictionary, Eleventh Edition (2003),' filed Dec. 18, 2014.
Inter Partes Review Case No. IPR2014-01372, Exhibit 2012, 'Cross-Examination transcript of Nader Bagherzadeh, Ph.D. , May 21, 2015,' filed Jun. 15, 2015.
Inter Partes Review Case No. IPR2014-01372, Exhibit 2013, 'Report to the Association for Computing,' filed Jun. 15, 2015.
Inter Partes Review Case No. IPR2014-01372, Exhibit 2014, 'MorphoSys—Case Study,' filed Jun. 15, 2015.
Inter Partes Review Case No. IPR2014-01372, Exhibit 2016, 'Declaration of Nadar Baghezadeh, Ph.D. ISO Motion to Stay,' filed Jun. 15, 2015.
Inter Partes Review Case No. IPR2014-01372, Exhibit 2017, 'Design and Implementation,' filed Jun. 15, 2015.
Inter Partes Review Case No. IPR2014-01372, Exhibit 2018, 'Deposition of Doanld Alpert, Ph.D., Feb. 12, 2015,' filed Jun. 15, 2015.
Inter Partes Review Case No. IPR2014-01372, Exhibit 2019, 'Declaration of Carl Sechen, Ph.D.,' filed Jun. 15, 2015.
Inter Partes Review Case No. IPR2014-01372, Exhibit 2020, 'Excerpts from Logic and Computer Design,' filed Jun. 15, 2015.
Inter Partes Review Case No. IPR2014-01372, Exhibit 2021, 'Excerpts from Digital Design Principles,' filed Jun. 15, 2015.
Inter Partes Review Case No. IPR2014-01372, Exhibit 2022, 'CMOS LVSI,' filed Jun. 15, 2015.
Inter Partes Review Case No. IPR2014-01372, Exhibit 2025, 'References reviewed by Examiner,' filed Jun. 15, 2015.
Inter Partes Review Case No. IPR2014-01372, Exhibit 2026, 'Excerpts from Digital Integrated Circuits,' filed Jun. 15, 2015.
Inter Partes Review Case No. IPR2014-01372, Exhibit 2027, 'Transcript of the Sep. 30, 2015 Conference Call,' filed Oct. 2, 2015.

Inter Partes Review Case No. IPR2014-01372, Exhibit 2028, 'Attachment to Oct. 19, 2015 Patent Owner Motion to Exclude,' filed Oct. 19, 2015.
Inter Partes Review Case No. IPR2014-01374, Corrected Petition For Inter Partes Review, filed Sep. 22, 2014.
Inter Partes Review Case No. IPR2014-01374, Patent Owner's Preliminary Response, filed Dec. 18, 2014.
Inter Partes Review Case No. IPR2014-01374, Patent Owner's Exhibit List, filed Dec. 18, 2014.
Inter Partes Review Case No. IPR2014-01374, Decision—Institution of Inter Partes Review 37 C.F.R. 42.108, filed Mar. 10, 2015.
Inter Partes Review Case No. IPR2014-01374, Patent Owner's Response, filed Jun. 15, 2015.
Inter Partes Review Case No. IPR2014-01374, Patent Owner's Corrected Response, filed Jun. 16, 2015.
Inter Partes Review Case No. IPR2014-01374, Petitioner's Motion To Exclude Evidence, filed Jul. 20, 2015.
Inter Partes Review Case No. IPR2014-01374, Petitioners Reply To POs Response, filed Sep. 10, 2015.
Inter Partes Review Case No. IPR2014-01374, Patent Owner's Objections to Evidence Filed With Petitioner Reply, filed Sep. 17, 2015.
Inter Partes Review Case No. IPR2014-01374, Petitioner SMART Request For Oral Argument, filed Sep. 24, 2015.
Inter Partes Review Case No. IPR2014-01374, Order—Trial Hearing—37 CFR 42.70, filed Oct. 8, 2015.
Inter Partes Review Case No. IPR2014-01374, Patent Owner's Request for Oral Argument, filed Oct. 16, 2015.
Inter Partes Review Case No. IPR2014-01374, Patent Owner Motion to Exclude, filed Oct. 16, 2015.
Inter Partes Review Case No. IPR2014-01374, Motion to Exclude Portions of Petitioner's Reply to Patent Owner's Response, filed Oct. 19, 2015.
Inter Partes Review Case No. IPR2014-01374, Patent Owner's Opposition to Petitioner's Motion to Exclude, filed Oct. 26, 2015.
Inter Partes Review Case No. IPR2014-01374, Patent Owner's Fourth Amended Exhibit List, filed Oct. 26, 2015.
Inter Partes Review Case No. IPR2014-01374, IPR2014-01374 SMART Response—PO Motion To Exclude Exhibits, filed Oct. 26, 2015.
Inter Partes Review Case No. IPR2014-01374, IPR2014-01374 SMART Response—PO Motion To Exclude Reply Portions, filed Oct. 26, 2015.
Inter Partes Review Case No. IPR2014-01374, Reply In Support of Patent Owner Motion to Exclude, filed Nov. 2, 2015.
Inter Partes Review Case No. IPR2014-01374, SMART Reply in Support of Motion to Exclude, filed Nov. 2, 2015.
Inter Partes Review Case No. IPR2014-01374, Record of Oral Hearing, filed Dec. 18, 2015.
Inter Partes Review Case No. IPR2014-01373, Corrected Petition For Inter Partes Review, filed Sep. 22, 2014.
Inter Partes Review Case No. IPR2014-01373, Patent Owner's Preliminary Response, filed Dec. 18, 2014.
Inter Partes Review Case No. IPR2014-01373, Patent Owner's Exhibit List, filed Dec. 18, 2014.
Inter Partes Review Case No. IPR2014-01373, Decision—Denying Institution of Inter Partes Review 37 C.F.R. 42.108, filed Mar. 13, 2015.
Inter Partes Review Case No. IPR2014-01375, Corrected Petition For Inter Partes Review, filed Sep. 22, 2014.
Inter Partes Review Case No. IPR2014-01375, Patent Owner's Preliminary Response, filed Dec. 18, 2014.
Inter Partes Review Case No. IPR2014-01375, Patent Owner's Exhibit List, filed Dec. 18, 2014.
Inter Partes Review Case No. IPR2014-01375, Decision—Denying Institution of Inter Partes Review 37 C.F.R. 42.108, filed Mar. 13, 2015.
Petition for Inter Partes Review filed on Apr. 7, 2015 for U.S. Pat. No. 8,081,536, IPR Case No. IPR2015-01021, and all associated documents including cited references and expert declarations.

(56) References Cited

OTHER PUBLICATIONS

Petition for Inter Partes Review filed on Apr. 7, 2015 for U.S. Pat. No. 7,881,150, IPR Case No. IPR2015-01020, and all associated documents including cited references and expert declarations.
Inter Partes Review of U.S. Pat. No. 8,001,434, IPR Case No. IPR2014-01372, Final Written Decision, issued Mar. 9, 2016.
Inter Partes Review Case No. IPR2014-01372, Petitionaler's Request for Rehearing, filed Apr. 6, 2016.
Inter Partes Review Case No. IPR2014-01372, Decision Denying Petitioner's Request for Rehearing, issued Jul. 11, 2016.
Inter Partes Review of U.S. Pat. No. 8,359,501, IPR Case No. IPR2014-01374, Final Written Decision, issued Mar. 9, 2016.
Inter Partes Review Case No. IPR2014-01374, Petitionaler's Request for Rehearing, filed Apr. 6, 2016.
Inter Partes Review Case No. IPR2014-01374, Decision Denying Petitioner's Request for Rehearing, issued Jul. 11, 2016.
Inter Partes Review of U.S. Pat. No. 8,001,434, IPR Case No. IPR2014-00970, Decision Denying Petitioner's Request for Rehearing, issued Apr. 27, 2016.
Inter Partes Review of U.S. Pat. No. 8,359,501, IPR Case No. IPR2014-00971, Petitioner's Request for Rehearing, filed Jan. 13, 2016.
Inter Partes Review Case No. IPR2014-00971, Decision—Petitioner's Request for Rehearing, issued Apr. 27, 2016.
Inter Partes Review Case No. IPR2014-00971, Final Written Decision, reissued Apr. 27, 2016.
Inter Partes Review Case No. IPR2014-00971, Netlist Inc.'s Notice of Appeal, filed Jun. 29, 2016.
Examination Report, European Patent Application No. 10730021.2, dated Apr. 29, 2015.
Response to Examination Report, European Patent Application No. 10730021.2, dated Apr. 29, 2015, filed Nov. 4, 2015.
English Translation of the Notice of Grounds for Rejection, Korean Patent Application No. 20127004038, dated May 11, 2016.
Inter panes review Case No. IPR2017-00561, Petition For Inter Panes Review Of U.S. Pat. No. 8,001,434, filed Jan. 5, 2017.
Inter panes review Case No. IPR2017-00561, Exhibit 1010 to Petition for Inter Panes Review, "EMC and the Printed Sircuit Board", filed Jan. 5, 2017.
Inter panes review Case No. IPR2017-00561, Exhibit 1012 to Petition for Inter Panes Review, "Microsoft Computer Dictionary (5th Ed.)", filed Jan. 5, 2017.
Inter partes review Case No. IPR2017-00561, Exhibit 1015 to Petition for Inter Partes Review, "JEDEC PC2-5300 RDIMM PCB Plot", filed Jan. 5, 2017.
Nter panes review Case No. IPR2017-00561, Exhibit 1015 to Petition for Inter Panes Review, "The American Heritage Dictionary", filed Jan. 5, 2017.
Nter panes review Case No. IPR2017-00561, Exhibit 1015 to Petition for Inter Panes Review, "Memory Systems", filed Jan. 5, 2017.
Nter panes review Case No. IPR2017-00561, Exhibit 1015 to Petition for Inter Panes Review, "Designing Embedded -lardware", filed Jan. 5, 2017.
Nter panes review Case No. IPR2017-00561, Exhibit 1015 to Petition for Inter Panes Review, "Micron DDR3 SDRAM JDIMM Specifications", filed Jan. 5, 2017.
Nter panes review Case No. IPR2017-00561, Exhibit 1015 to Petition for Inter Panes Review, "JEDEC PC2-5300 RDIMM Assembly", filed Jan. 5, 2017.
Nter panes review Case No. IPR2017-00561, Exhibit 1015 to Petition for Inter Panes Review, "Micron—Technical Vote TN4720. DDR2 (Point-to-Point) Package Sizes and Layout Basics", filed Jan. 5, 2017.
Inter panes review Case No. IPR2017-00561, Exhibit 1015 to Petition for Inter Panes Review, "Declaration of Dr. Jinaki Mazumder", filed Jan. 5, 2017.
Inter panes review Case No. IPR2017-00562, Petition For Inter Panes Review Of U.S. Pat. No. 8,359,501, filed Jan. 3, 2017.
Inter panes review Case No. IPR2017-00560, Petition For Inter Panes Review Of U.S. Pat. No. 8,689,064, filed Jan. 3, 2017.
Inter Partes Review of U.S. Pat. No. 8,00,1434, Case No. IPR2017-00561, Patent Owner's Preliminary Response, lied Apr. 10, 2017.
Inter Partes Review of U.S. Pat. No. 8,00,1434, Case No. IPR2017-00561, Exhibit 2004—Excerpts from Microsoft Somputer Dictionary Fifth Edition (2002), filed Apr. 10, 2017.
Inter Partes Review of U.S. Pat. No. 8,00,1434, Case No. IPR2017-00561, Exhibit 2005—Qualcomm Announces Sampling of the MSM6250, filed Apr. 10, 2017.
Inter Partes Review of U.S. Pat. No. 8,00,1434, Case No. IPR2017-00561, Trial Instituted Document, filed Jul. 7, 2017.
Nter Partes Review of U.S. Pat. No. 8,359,501, Case No. IPR2017-00562, Patent Owner's Preliminary Response, lied Apr. 10, 2017.
Inter Partes Review of U.S. Pat. No. 8,359,501, Case No. IPR2017-00562, Trial Instituted Document, filed Jul. 7, 2017.
Inter Partes Review of U.S. Pat. No. 8,689,064, Case No. IPR2017-00560, Patent Owner's Preliminary Response, filed Apr. 10, 2017.
Inter Partes Review of U.S. Pat. No. 8,689,064, Case No. IPR2017-00560, Trial Instituted Document, filed May 15, 2017.
Inter Partes Review of U.S. Pat. No. 8,689,064, Case No. IPR2017-00560, Patent Owner's Response, filed Oct. 31, 2017.
Inter Partes Review of U.S. Pat. No. 8,689,064, Case No. IPR2017-00560, Petitioners' Reply, filed Dec. 21, 2017.
Inter Partes Review of U.S. Pat. No. 8,689,064, Case No. IPR2017-00560, Petitioners Motion to Exclude, filed Jan. 9, 2018.
Inter Partes Review of U.S. Pat. No. 8,689,064, Case No. IPR2017-00560, Patent Owner's Listing of New Arguments and Evidence in Petitioners' Reply, filed Jan. 23, 2018.
Inter Partes Review of U.S. Pat. No. 8,689,064, Case No. IPR2017-00560, Patent Owner's Opposition to Petitioners' Motion to Exclude, filed Jan. 23, 2018.
Inter Partes Review of U.S. Pat. No. 8,689,064, Case No. IPR2017-00560, Petitioners' Response to Patent Owner's Listing of New Arguments and Evidence in Petitioners' Reply, filed Jan. 30, 2018.
Inter Partes Review of U.S. Pat. No. 8,689,064, Case No. IPR2017-00560, Petitioners Reply to Patent Owner's Opposition to Motion to Exclude, filed Jan. 30, 2018.
Inter Partes Review of U.S. Pat. No. 8,689,064, Case No. IPR2017-00560, Exhibits 1003, 'Declaration of Dr. Mazumder,' filed Jan. 3, 2017.
Inter Partes Review of U.S. Pat. No. 8,689,064, Case No. IPR2017-00560, Exhibits 2001, 'U.S. Appl. No. 60/456,451 (Averbuj),' filed Apr. 10, 2017.
Inter Partes Review of U.S. Pat. No. 8,689,064, Case No. IPR2017-00560, Exhibits 2002, 'Prosecution file history of U.S. Appl. No. 10/630,480 (Averbuj),' filed Apr. 10, 2017.
Inter Partes Review of U.S. Pat. No. 8,689,064, Case No. IPR2017-00560, Exhibits 2004, 'Excerpts from Microsoft Computer Dictionary Fifth Edition (2002),' filed Apr. 10, 2017.
Inter Partes Review of U.S. Pat. No. 8,689,064, Case No. IPR2017-00560, Exhibits 2005, 'Qualcomm Announces Sampling of the MSM6250,' filed Apr. 10, 2017.
Inter Partes Review of U.S. Pat. No. 8,689,064, Case No. IPR2017-00560, Exhibits 2007, 'Deposition transcript of Dr. Mazumder,' filed Oct. 31, 2017.
Inter Partes Review of U.S. Pat. No. 8,689,064, Case No. IPR2017-00560, Exhibits 2008, 'Search on Amazon website for memory module,' filed Oct. 31, 2017.
Inter Partes Review of U.S. Pat. No. 8,689,064, Case No. IPR2017-00560, Exhibits 2006, 'Excerpts from Testing and Testable Design of High-Density,' filed Oct. 31, 2017.
Inter Partes Review of U.S. Pat. No. 8,689,064, Case No. IPR2017-00560, Exhibits 2014, 'JEDEC Standard, JESD205 (2007),' filed Oct. 31, 2017.
Inter Partes Review of U.S. Pat. No. 8,689,064, Case No. IPR2017-00560, Exhibits 2010, 'Declaration of R. Jacob Baker, Ph.D., P.E.,' filed Oct. 31, 2017.
Inter Partes Review of U.S. Pat. No. 8,689,064, Case No. IPR2017-00560, Exhibits 2011, 'Kingston press release from Oct. 11, 2005,' filed Oct. 31, 2017.

(56) References Cited

OTHER PUBLICATIONS

Inter Partes Review of U.S. Pat. No. 8,689,064, Case No. IPR2017-00560, Exhibits 2012, 'IPR2014-00882, Paper 33, FWD,' filed Oct. 31, 2017.
Inter Partes Review of U.S. Pat. No. 8,689,064, Case No. IPR2017-00560, Exhibits 2013, 'Excerpts from Merriam-Webster's Dictionary (2006),' filed Oct. 31, 2017.
Inter Partes Review of U.S. Pat. No. 8,689,064, Case No. IPR2017-00560, Exhibits 2015, 'Excerpts from Memory Systems by Jacob (2007),' filed Oct. 31, 2017.
Inter Partes Review of U.S. Pat. No. 8,689,064, Case No. IPR2017-00560, Exhibits 1026, 'Deposition Transcript of R. Jacob Baker,' filed Dec. 21, 2017.
Inter Partes Review of U.S. Pat. No. 8,689,064, Case No. IPR2017-00560, Exhibits 1029, '*Netlist, Inc.* v. *SanDisk LLC*, No. 2016-02274, ECF No. 69-2 (Fed. Cir. Nov. 14, 2017),' filed Dec. 21, 2017.
Inter Partes Review of U.S. Pat. No. 8,689,064, Case No. IPR2017-00560, Exhibits 1030, 'JEDEC Standard Document JESD84-A41: Embedded Multimedia Card (eMMC) Product Standard, Standard Capacity (Jun. 2007),' filed Dec. 21, 2017.
Inter Partes Review of U.S. Pat. No. 8,001,434, Case No. IPR2017-00561, Patent Owner's Preliminary Response, filed Apr. 10, 2017.
Inter Partes Review of U.S. Pat. No. 8,001,434, Case No. IPR2017-00561, Patent Owner's Response, filed Nov. 21, 2017.
Inter Partes Review of U.S. Pat. No. 8,001,434, Case No. IPR2017-00561, Exhibits 1015, 'JEDEC PC2-5300 RDIMM PCB Plot,' filed Jan. 3, 2017.
Inter Partes Review of U.S. Pat. No. 8,001,434, Case No. IPR2017-00561, Exhibits 1003, 'Declaration of Dr. Mazumder.,' filed Jan. 3, 2017.
Inter Partes Review of U.S. Pat. No. 8,001,434, Case No. IPR2017-00561, Exhibits 2001, 'U.S. Appl. No. 60/456,451 (Averbuj),' filed Apr. 10, 2017.
Inter Partes Review of U.S. Pat. No. 8,001,434, Case No. IPR2017-00561, Exhibits 2002, 'Prosecution file history of U.S. Appl. No. 10/630,480 (Averbuj),' filed Apr. 10, 2017.
Inter Partes Review of U.S. Pat. No. 8,001,434, Case No. IPR2017-00561, Exhibits 2010, 'Declaration of R. Jacob Baker, Ph.D., P.E.,' filed Nov. 21, 2017.
Inter Partes Review of U.S. Pat. No. 8,001,434, Case No. IPR2017-00561, Exhibits 2012, 'Understanding DRAM, IBM application,' filed Nov. 21, 2017.
Inter Partes Review of U.S. Pat. No. 8,001,434, Case No. IPR2017-00561, Exhibits 2013, '2016-2666, U.S. CAFC, IPR2014-01374 FWD affitilled,' filed Nov. 21, 2017.
Inter Partes Review of U.S. Pat. No. 8,001,434, Case No. IPR2017-00561, Exhibits 2014, '2016-2274, U.S. CAFC, IPR2014-00971 FWD affirmed,' filed Nov. 21, 2017.
Inter Partes Review of U.S. Pat. No. 8,359,501, Case No. IPR2017-00562, Patent Owner's Preliminary Response, filed Apr. 10, 2017.
Inter Partes Review of U.S. Pat. No. 8,359,501, Case No. IPR2017-00562, Patent Owner's Response, filed Nov. 21, 2017.
Inter Partes Review of U.S. Pat. No. 8,359,501, Case No. IPR2017-00562, Exhibits 1003, 'Declaration of Dr. Mazumder.,' filed Jan. 3, 2017.
Inter Partes Review of U.S. Pat. No. 8,359,501, Case No. IPR2017-00562, Exhibits 2010, 'Declaration of R. Jacob Baker, Ph.D., P.E.,' filed Nov. 21, 2017.
Inter Partes Review of U.S. Pat. No. 8,689,064, Case No. IPR2017-00560, Petitioners' Updated Exhibit List, filed Feb. 9, 2018.
Inter Partes Review of U.S. Pat. No. 8,689,064, Case No. IPR2017-00560, Patent Owner's Updated Exhibit List, filed Feb. 9, 2018.
Inter Partes Review of U.S. Pat. No. 8,689,064, Case No. IPR2017-00560, Hearing Transcript, filed Mar. 22, 2018.
Inter Partes Review of U.S. Pat. No. 8,689,064, Case No. IPR2017-00560, Termination Decision Document, filed May 3, 2018.
Inter Partes Review of U.S. Pat. No. 8,689,064, Case No. IPR2017-00560, Exhibits 1034, 'Petitioners Demonstratives,' filed Feb. 9, 2018.
Inter Partes Review of U.S. Pat. No. 8,689,064, Case No. IPR2017-00560, Exhibits 2016, 'Patent Owner's Demonstratives,' filed Feb. 9, 2018.
Inter Partes Review of U.S. Pat. No. 8,001,434, Case No. IPR2017-00561, Petitioners Reply, filed Feb. 7, 2018.
Inter Partes Review of U.S. Pat. No. 8,001,434, Case No. IPR2017-00561, Petitioners' Motion to Exclude, filed Feb. 28, 2018.
Inter Partes Review of U.S. Pat. No. 8,001,434, Case No. IPR2017-00561, Patent Owner's Motion to Exclude, filed Feb. 28, 2018.
Inter Partes Review of U.S. Pat. No. 8,001,434, Case No. IPR2017-00561, Patent Owner's Opposition to Petitioners' Motion to Exclude, filed Mar. 14, 2018.
Inter Partes Review of U.S. Pat. No. 8,001,434, Case No. IPR2017-00561, Petitioners' Opposition to Patent Owner's Motion to Exclude, filed Mar. 14, 2018.
Inter Partes Review of U.S. Pat. No. 8,001,434, Case No. IPR2017-00561, Petitioners' Brief in Response to Show Cause Order, filed Mar. 20, 2018.
Inter Partes Review of U.S. Pat. No. 8,001,434, Case No. IPR2017-00561, Patent Owner's Submission Regarding Order to Show Cause, filed Mar. 20, 2018.
Inter Partes Review of U.S. Pat. No. 8,001,434, Case No. IPR2017-00561, Petitioners' Reply to Patent Owner's Opposition to Motion to Exclude, filed Mar. 21, 2018.
Inter Partes Review of U.S. Pat. No. 8,001,434, Case No. IPR2017-00561, Patent Owner's Reply in Support of Its Motion to Exclude, filed Mar. 21, 2018.
Inter Partes Review of U.S. Pat. No. 8,001,434, Case No. IPR2017-00561, Patent Owner's Motion to Strike, filed Mar. 28, 2018.
Inter Partes Review of U.S. Pat. No. 8,001,434, Case No. IPR2017-00561, Petitioners' Opposition to Patent Owner's Motion to Strike, filed Apr. 4, 2018.
Inter Partes Review of U.S. Pat. No. 8,001,434, Case No. IPR2017-00561, Order To Show Cause Conduct of the Proceedings, filed Mar. 13, 2018.
Inter Partes Review of U.S. Pat. No. 8,001,434, Case No. IPR2017-00561, Request for Oral Argument 37 C.F.R. sec 42.70, filed Mar. 28, 2018.
Inter Partes Review of U.S. Pat. No. 8,001,434, Case No. IPR2017-00561, Hearing Transcript, filed Apr. 18, 2018.
Inter Partes Review of U.S. Pat. No. 8,001,434, Case No. IPR2017-00561, Conduct of the Proceeding, filed May 2, 2018.
Inter Partes Review of U.S. Pat. No. 8,001,434, Case No. IPR2017-00561, Exhibits 1034, '*Netlist, Inc.* v. *SanDisk LLC*, No. 2016-02274, ECF No. 70 (Fed. Cir. Dec. 21, 2017),' filed Feb. 7, 2018.
Inter Partes Review of U.S. Pat. No. 8,001,434, Case No. IPR2017-00561, Exhibits 1036, '*Netlist, Inc.* v. *SanDisk LLC*, No. 2016-02274, ECF No. 43 (Fed. Cir. Apr. 6, 2017),' filed Feb. 7, 2018.
Inter Partes Review of U.S. Pat. No. 8,001,434, Case No. IPR2017-00561, Exhibits 1028, '*SanDisk Corp.* v. *Netlist Inc.*, IPR2014-00970, Final Written Dec.,' filed Feb. 7, 2018.
Inter Partes Review of U.S. Pat. No. 8,001,434, Case No. IPR2017-00561, Exhibits 1035, '*Netlist, Inc.* v. *SanDisk LLC*, No. 2016-02274, ECF No. 31 (Fed. Cir. Jan. 6, 2017),' filed Feb. 7, 2018.
Inter Partes Review of U.S. Pat. No. 8,359,501, Case No. IPR2017-00562, Petitioners Reply, filed Feb. 7, 2018.
Inter Partes Review of U.S. Pat. No. 8,359,501, Case No. IPR2017-00562, Petitioners' Motion to Exclude, filed Feb. 28, 2018.
Inter Partes Review of U.S. Pat. No. 8,359,501, Case No. IPR2017-00562, Petitioners' Request for Oral Argument, filed Feb. 28, 2018.
Inter Partes Review of U.S. Pat. No. 8,359,501, Case No. IPR2017-00562, Patent Owner's Motion to Exclude, filed Feb. 28, 2018.
Inter Partes Review of U.S. Pat. No. 8,359,501, Case No. IPR2017-00562, Order To Show Cause Conduct of the Proceedings, filed Mar. 13, 2018.
Inter Partes Review of U.S. Pat. No. 8,359,501, Case No. IPR2017-00562, Patent Owner's Opposition to Petitioners' Motion to Exclude, filed Mar. 14, 2018.
Inter Partes Review of U.S. Pat. No. 8,359,501, Case No. IPR2017-00562, Petitioners' Opposition to Patent Owner's Motion to Exclude, filed Mar. 14, 2018.

(56) References Cited

OTHER PUBLICATIONS

Inter Partes Review of U.S. Pat. No. 8,359,501, Case No. IPR2017-00562, Petitioners' Brief in Response to Show Cause Order, filed Mar. 20, 2018.
Inter Partes Review of U.S. Pat. No. 8,359,501, Case No. IPR2017-00562, Patent Owner's Submission Regarding Order to Show Cause, filed Mar. 20, 2018.
Inter Partes Review of U.S. Pat. No. 8,359,501, Case No. IPR2017-00562, Petitioners' Reply to Patent Owner's Opposition to Motion to Exclude, filed Mar. 21, 2018.
Inter Partes Review of U.S. Pat. No. 8,359,501, Case No. IPR2017-00562, Patent Owner's Reply in Support of Its Motion to Exclude, filed Mar. 21, 2018.
Inter Partes Review of U.S. Pat. No. 8,359,501, Case No. IPR2017-00562, Patent Owner's Motion to Strike, filed Mar. 28, 2018.
Inter Partes Review of U.S. Pat. No. 8,359,501, Case No. IPR2017-00562, Petitioners' Opposition to Patent Owner's Motion to Strike, filed Apr. 4, 2018.
Inter Partes Review of U.S. Pat. No. 8,359,501, Case No. IPR2017-00562, Hearing Transcript, filed Apr. 18, 2018.
Inter Partes Review of U.S. Pat. No. 8,001,434 B1, Case No. IPR2017-00561, Final Written Decision, filed Jul. 5, 2018.
Inter Partes Review of U.S. Pat. No. 8,359,501 B1, Case No. IPR2017-00562, Final Written Decision, filed Jul. 5, 2018.
Inter Partes Review of U.S. Pat. No. 10,217,523, Case No. IPR2020-01421, Petition for Inter Partes Review of U.S. Pat. No. 10,217,523, filed Aug. 21, 2020.
Inter Partes Review of U.S. Pat. No. 10,217,523, Case No. IPR2020-01421, Exhibits 1003, 'Declaration of Vivek Subramanian,' filed Aug. 21, 2020.
Inter Partes Review of U.S. Pat. No. 10,217,523, Case No. IPR2020-01421, Exhibits 1009, 'Final Written Decision, *SanDisk Corp.* v. *Netlist Inc.*, Paper No. 32, IPR2014-00970 (Dec. 14, 2015),' filed Aug. 21, 2020.
Inter Partes Review of U.S. Pat. No. 10,217,523, Case No. IPR2020-01421, Exhibits 1012, 'Bruce Jacob et al., Memory System: Cache, DRAM, Disk (2008) (excerpts),' filed Aug. 21, 2020.
Inter Partes Review of U.S. Pat. No. 10,217,523, Case No. IPR2020-01421, Exhibits 1014, 'Stone, H.S. Microcomputer Interfacing, Reading, MA: Addison Wesley (1982),' filed Aug. 21, 2020.
Inter Partes Review of U.S. Pat. No. 10,217,523, Case No. IPR2020-01421, Exhibits 1013, 'Final Written Decision, *SK hynix Inc.* v. *Netlist, Inc.*, Paper No. 29, IPR2018-00362 (Jun. 27, 2019),' filed Aug. 21, 2020.
Inter Partes Review of U.S. Pat. No. 10,217,523, Case No. 1PR2020-01421, Exhibits 1015, 'JEDEC Standard 21-C, DDR SDRAM Registered DIMM Design Specification (Jan. 2002),' filed Aug. 21, 2020.
Inter Partes Review of U.S. Pat. No. 10,217,523, Case No. IPR2020-01421, Exhibits 1016, 'JEDEC Standard, FBDIMM Advanced Memory Buffer (AMB), JESD82-20A (Mar. 2009),' filed Aug. 21, 2020.
Inter Partes Review of U.S. Pat. No. 10,217,523, Case No. IPR2020-01421, Exhibits 1017, 'JEDEC Standard, Fully Buffered DIMM Design for Test, Design for Validation (DFx), JESD82-28A (Jul. 2008),' filed Aug. 21, 2020.
Inter Partes Review of U.S. Pat. No. 10,217,523, Case No. IPR2020-01421, Exhibits 1025, 'Final Written Decision, *SK hynix Inc.* v. *Netlist, Inc.*, Paper No. 36, IPR2017-00561 (Jul. 5, 2018),' filed Aug. 21, 2020.
Inter Partes Review of U.S. Pat. No. 10,217,523, Case No. IPR2020-01421, Exhibits 1028, 'JEDEC Standard, DDR2 SDRAM Specification, JESD79-2B (Jan. 2005),' filed Aug. 21, 2020.
Inter Partes Review of U.S. Pat. No. 10,217,523, Case No. IPR2020-01421, Exhibits 1029, 'JEDEC Standard, Double Data Rate (DDR) SDRAM Specification, JESD79 (Jun. 2000),' filed Aug. 21, 2020.
Inter Partes Review of U.S. Pat. No. 10,217,523, Case No. IPR2020-01421, Exhibits 1031, 'JEDEC Standard, DDR3 SDRAM Standard, JESD79-3 (Jun. 2007),' filed Aug. 21, 2020.
Inter Partes Review of U.S. Pat. No. 10,217,523, Case No. IPR2020-01421, Exhibits 1033, 'Final Written Decision, *SK hynix Inc.* v. *Netlist, Inc.*, Paper No. 36, IPR2017-00562 (Jul. 5, 2018),' filed Aug. 21, 2020.
Inter Partes Review of U.S. Pat. No. 10,217,523, Case No. IPR2020-01421, Exhibits 1034, 'Termination Decision, *SK hynix Inc.* v. *Netlist, Inc.*, Paper No. 30, IPR2017-00560 (May 3, 2018),' filed Aug. 21, 2020.
Inter Partes Review of U.S. Pat. No. 10,217,523, Case No. IPR2020-01421, Exhibits 1038, 'Petition for Inter Partes Review of U.S. Pat. No. 10,474,595,' filed Aug. 21, 2020.
Inter Partes Review of U.S. Pat. No. 10,217,523, Case No. IPR2020-01421, Exhibits 1022, 'Micron, Technical Note 4720: (Point-to-Point) Package Sizes and Layout Basics, Rev. A, 2006,' filed Aug. 21, 2020.
Inter Partes Review of U.S. Pat. No. 10,217,523, Case No. IPR2020-01421, Exhibits 1024, 'Montrose, M., "EMC and the Printed Circuit Board" Page Excerpts,' filed Aug. 21, 2020.
Inter Partes Review of U.S. Pat. No. 10,217,523, Case No. IPR2020-01421, Exhibits 1039, '*Netlist* v. *SK hynix America, SK Hynix memory solutions inc.* Case No. 18-2123, Judgment (Dec. 12, 2019),' filed Aug. 21, 2020.
Inter Partes Review of U.S. Pat. No. 10,217,523, Case No. IPR2020-01421, Exhibits 1040, '*Netlist* v. *SK hynix America, SK Hynix memory solutions inc.* Case No. 18-2357, Judgment (Dec. 12, 2019),' filed Aug. 21, 2020.
Inter Partes Review of U.S. Pat. No. 10,217,523, Case No. IPR2020-01421, Exhibits 1041, 'Final Written Decision, *NHK Spring Co., Ltd.*, v. *Intri-Plex Technologies, Inc.*, Paper No. 8, IPR2018-00752 (Sep. 12, 2018),' filed Aug. 21, 2020.
Inter Partes Review of U.S. Pat. No. 10,217,523, Case No. IPR2020-01421, Exhibit 1043, 'Decision Granting Institution of Inter Partes Review, *SK Hynix Inc. et al.* v. *Netlist, Inc.*, Paper No. 14, IPR2020-01042,' Dec. 17, 2020, 47 pgs.
Inter Partes Review of U.S. Pat. No. 10,217,523, Case No. IPR2020-01421, Exhibit 1044, 'Decision Granting Institution of Inter Partes Review, *SK Hynix Inc. et al.* v. *Netlist, Inc.*, Paper No. 13, IPR2020-01044,' Dec. 17, 2020, 55 pgs.
Inter Partes Review of U.S. Pat. No. 10,217,523, Case No. IPR2020-01421, Exhibit 1047, '*Netlist, Inc.* v. *SK Hynix Inc. et al.*, No. 8:16-cv-01605, Complaint for Patent Infringement; Demand For Jury Trial (C.D. Cal. Aug. 31, 2016), ECF No. 1,' Aug. 31, 2016, 20 pgs.
Inter Partes Review of U.S. Pat. No. 10,217,523, Case No. IPR2020-01421, Exhibit 1055, 'In re Intel Corp., No. 2021-105, Order (Fed. Cir. Dec. 23, 2020), ECF No. 14,' Dec. 23, 2020, 6 pgs.
Inter Partes Review of U.S. Pat. No. 10,217,523, Case No. IPR2020-01421, Exhibit 1057, '*Netlist, Inc.* v. *SK Hynix Inc. et al.*, No. 6:20-cv-00194, Netlist, Inc.'s Complaint For Patent Infringement (W.D. Tex. Mar. 17, 2020), ECF No. 1,' Mar. 17, 2020, 16 pgs.
Inter Partes Review of U.S. Pat. No. 10,217,523, Case No. IPR2020-01421, Exhibit 1061, '*Netlist, Inc.* v. *SK Hynix Inc. et al.*, No. 6:20-cv-00525, Netlist's Complaint For Patent Infringement (W.D. Tex. Jun. 15, 2020), ECF No. 1,' Jun. 15, 2020, 611 pgs.
Inter Partes Review of U.S. Pat. No. 10,217,523, Case No. IPR2020-01421, Exhibit 2002, 'Claim Construction Order, *STC.UNM* v. *Apple Inc.*, 1:20-cv-00351-ADA, ECF 73,' Jun. 8, 2020, 1 pg.
Inter Partes Review of U.S. Pat. No. 10,217,523, Case No. IPR2020-01421, Exhibit 2003, 'Claim Construction Order, *UNILOC 2017 LLC* v. *Apple Inc.*, 6:19-cv-00532-ADA, ECF 69,' Jun. 8, 2020, 1 pg.
Inter Partes Review of U.S. Pat. No. 10,217,523, Case No. IPR2020-01421, Exhibit 2004, 'Claim Construction Order, *MV3 Partners LLC* v. *Roku Inc.*, 6:18-cv-00308-ADA, ECF 90,' Oct. 2, 2019, 15 pgs.
Inter Partes Review of U.S. Pat. No. 10,217,523, Case No. IPR2020-01421, Exhibit 2008, 'Preliminary Invalidity Contentions, *Netlist, Inc.* v. *SK hynix et al.*, 6:20-cv-194-ADA' Dec. 4, 2020, 42 pgs.
Inter Partes Review of U.S. Pat. No. 10,217,523, Case No. IPR2020-01421, Exhibit 2011, 'Exhibit A1 of Defendants' Invalidity Contentions, *Netlist, Inc.* v. *SK hynix et al.*, 6:20-cv-194-ADA,' Dec. 4, 2020, 824 pgs.

(56) References Cited

OTHER PUBLICATIONS

Inter Partes Review of U.S. Pat. No. 10,217,523, Case No. IPR2020-01421, Exhibit 2012, 'Exhibit B08 of Defendants' Invalidity Contentions, *Netlist, Inc.* v. *SK hynix et al.*, 6:20-cv-194-ADA,' Dec. 4, 2020, 174 pgs.

Inter Partes Review of U.S. Pat. No. 10,217,523, Case No. IPR2020-01421, Exhibit 2013, 'Exhibit B01 of Defendants' Invalidity Contentions, *Netlist, Inc.* v. *SK hynix et al.*, 6:20-cv-194-ADA,' Dec. 4, 2020, 370 pgs.

Inter Partes Review of U.S. Pat. No. 10,217,523, Case No. IPR2020-01421, Exhibit 2014, 'Exhibit B14 of Defendants' Invalidity Contentions, *Netlist, Inc.* v. *SK hynix et al.*, 6:20-cv-194-ADA,' Dec. 4, 2020, 39 pgs.

Inter Partes Review of U.S. Pat. No. 10,217,523, Case No. IPR2020-01421, Paper 6, 'Patent Owner's Preliminary Response Pursuant to 37 C.F.R § 42.107(a),' Dec. 18, 2020, 50 pgs.

Inter Partes Review of U.S. Pat. No. 10,217,523, Case No. IPR2020-01421, Paper 7, 'Petitioners' Reply to Patent Owner's Preliminary Response,' Jan. 6, 2021, 17 pgs.

Inter Partes Review of U.S. Pat. No. 10,217,523, Case No. IPR2020-01421, 'Patent Owner's Sur-Reply on the Fintiv Factors,' Paper 8, Jan. 13, 2021, 14 pgs.

Inter Partes Review of U.S. Pat. No. 10,217,523, Case No. IPR2020-01421, 'Decision Granting Institution of Inter Partes Review,' Paper No, 10, Mar. 16, 2021, 47 pgs.

Inter Partes Review of U.S. Pat. No. 10,217,523, Case No. IPR2020-01421, 'Termination Due to Settlement After Institution of Trial,' Paper 16, May 6, 2021, 5 pgs.

Inter Panes Review of U.S. Pat. No. 10,217,523, Case No. IPR2022-00063, 'Petition for Inter Partes Review of U.S. Pat. No. 10,217,523,' Paper No. 1, Oct. 15, 2021, 147 pgs.

Inter Partes Review of U.S. Pat. No. 10,217,523, Case No. IPR2022-00063, Exhibit 1003, 'Declaration of Vivek Subramanian Regarding U.S. Pat. No. 10,217,523,' filed Oct. 15, 2021, 334 pgs.

Inter Partes Review of U.S. Pat. No, 10,217,523, Case No. IPR2022-00063, Exhibit 1012, 'Bruce Jacob et al., Memory Systems—Cache, DRAM, Disk (Elsevier Inc. 2008),' filed Oct. 15, 2021, 300 pgs.

Inter Partes Review of U.S. Pat. No. 10,217,523, Case No. IPR2022-00063, Exhibit 1045, '*Netlist, Inc.* vs. *SK Hynix Inc. et al.*, 6-20-CV-00194-ADA, 6-20-CV-00525-ADA, Claim Construction Order (United States District Court for the Western District of Texas Waco Division, issued Mar. 12, 2021 May 6, 2017),' filed Oct. 15, 2021, 5 pgs.

Inter Partes Review of U.S. Pat. No. 10,217,523, Case No. IPR2022-00063, Exhibit 1049, '*Netlist, Inc.* vs. *SK Hynix Inc et al.*, No. 8:16-cv-01605-JLS-JCG, Defendant's Opening Claim Construction Brief (United States District Court, Central District of California, Southern Division, Document 123, Filed May 6, 2017, Page ID #: 2658-2687),' filed Oct. 15, 2021, 30 pgs.

Inter Partes Review of U.S. Pat. No. 10,217,523, Case No. IPR2022-00063, Exhibit 1051, '*Netlist, Inc.* vs. *Samsung Electronics Co., Ltd., et al.*, Redacted Defendant Samsung Electronics Co. Ltd.'s Notice of Motion and Motions for Judgement on the Pleadings (United States District Court, Central District of California, Southern Division, Case 8:20-cv-00993-MCS-DFM Document 60 Filed Jun. 22, 2021, Page ID #:529-553),' filed Oct. 15, 2021, 25 pg.

Inter Partes Review of U.S. Pat. No. 10,217,523, Case No. IPR2022-00063, Exhibit 1054, '*Samsung Electronics Co., Ltd.*, et al. vs. *Netlist, Inc.*, Complaint for Declaratory Judgment of Non-Infringement and Unenforceability; Breach of Contract (United States District Court for the District of Delaware, Case 1:21-cv-01453-UNA Document 1 Filed Oct. 15, 2021, PageID #: 1-82),' filed Oct. 15, 2021, 82 pg.

Inter Partes Review of U.S. Pat. No. 10,217,523, Case No. IPR2022-00063, 'Patent Owner's Preliminary Response,' filed Feb. 18, 2022, 56 pgs.

Inter Partes Review of U.S. Pat. No. 10,217,523, Case No. IPR2022-00063, Exhibit 2001, 'Declaration of Michael C. Brogioli, Ph.D,' filed Feb. 18, 2022, 66 pgs.

Inter Partes Review of U.S. Pat. No. 10,217,523, Case No. IPR2022-00063, 'Petitioner's Authorized Reply To Patent Owner's Preliminary Response,' filed Mar. 18, 2022, 14 pgs.

Inter Partes Review of U.S. Pat. No. 10,217,523, Case No. IPR2022-00063, 'Petitioner's Updated Exhibit List,' filed Mar. 18, 2022, 7 pgs.

Inter Partes Review of U.S. Pat. No. 10,217,523, Case No. IPR2022-00063, 'Patent Owner's Authorized Sur-Reply in Support of Its Preliminary Response,' filed Mar. 25, 2022, 9 pgs.

Inter Partes Review of U.S. Pat. No. 10,217,523, Case No. IPR2022-00063, 'Decision—Granting Institution of Inter Partes Review,' issued May 5, 2022, 53 pgs.

Inter Partes Review of U.S. Pat. No. 9,606,907, Case No. IPR2018-00362, 'Petition for Inter Partes Review of U.S. Pat. No. 9,606,907' filed Dec. 22, 2017, 121 pgs.

United States International Trade Commission, In the Matter of Certain Memory Modules and Components Thereof, and Products Containing Same, Case No. Inv. No. 337-TA-1023, "Initial Determination on Violation of Section 337," Nov. 14, 2017, 206 pgs.

Inter Partes Review of U.S. Pat. No. 10,217,523, Case No. IPR2022-00063, Patent Owner's Response, filed Aug. 4, 2022, 83 pgs.

Inter Partes Review of U.S. Pat. No. 10,217,523, Case No. IPR2022-00063, Petitioners' Reply To Patent Owner's Response, filed Oct. 27, 2022, 62 pgs.

Inter Partes Review of U.S. Pat. No. 10,217,523, Case No. IPR2022-00063, Patent Owner's Sur-Reply, filed Dec. 8, 2022, 38 pgs.

Inter Partes Review of U.S. Pat. No. 10,217,523, Case No. IPR2022-00063, Petitioner's Demonstratives for Oral Argument, filed Jan. 26, 2023, 131 pgs.

Inter Partes Review of U.S. Pat. No. 10,217,523, Case No. IPR2022-00063, Patent Owner's Demonstratives for Oral Argument, filed Jan. 26, 2023, 73 pgs.

Inter Partes Review of U.S. Pat. No. 10,217,523, Case No. IPR2022-00063, Exh. 1067, 'Quad Band Memory', VIT Technology Forum 2003, filed Dec. 12, 2022, 24 pgs.

Inter Partes Review of U.S. Pat. No. 10,217,523, Record of Oral Hearing, entered Feb. 27, 2023, 85 pgs.

Inter Partes Review of U.S. Pat. No. 10,217,523, Case No. IPR2022-00063, Final Written Decision, dated May 3, 2023, 59 pgs.

\* cited by examiner

MULTI MODE MEMORY MODULE WITH DATA HANDLERS

CROSS-REFERENCE TO RELATED APPLICATIONS

The present application is a continuation of U.S. patent application Ser. No. 14/229,844, filed Mar. 29, 2014, now U.S. Pat. No. 10,217,523, which is a continuation of U.S. patent application Ser. No. 13/745,790, filed Jan. 19, 2013, now U.S. Pat. No. 8,689,064, which is a continuation of U.S. patent application Ser. No. 13/183,253, filed Jul. 14, 2011, now U.S. Pat. No. 8,359,501, which is a continuation of U.S. patent application Ser. No. 12/422,925, filed Apr. 13, 2009, now U.S. Pat. No. 8,001,434, which claims the benefit of priority from U.S. Provisional Application No. 61/044,801, filed Apr. 14, 2008, U.S. Provisional Application No. 61/044,825, filed Apr. 14, 2008, and U.S. Provisional Application No. 61/044,839, filed Apr. 14, 2008. Each of the foregoing applications is incorporated in their entirety by reference herein. This application is related to U.S. patent application Ser. No. 12/422,912, filed on Apr. 13, 2009 and entitled "Self-Adjusting Damper", and to U.S. application Ser. No. 12/422,853, filed on Apr. 13, 2009 and entitled "Circuit Providing Load Isolation and Noise Reduction", both of which are incorporated in their entirety by reference herein.

BACKGROUND

Field

The present invention relates to self-testing electronic modules and, more particularly, to self-testing electronic memory modules.

Description of the Related Art

The failure of memory components in an electronic system may result in the loss of valid data. Therefore, it is important to ensure proper memory operation in an electronic system. Memory integrated circuits ("memory chips") often go through a series of tests at various stages of system manufacture. Once memory chips are deployed in a system, they also generally go through a system level memory test each time the system is booted. In addition, memory chips may undergo a parity checking process during normal system operation.

There are typically at least three test phases which memories undergo during system manufacture. Each phase generally tests for memory defects and for the correct operation of the input/output interface. The first test phase is typically conducted by the memory chip manufacturer and generally involves checking for bit failures, correct memory access speed, etc. The second test phase is typically done by memory module manufacturers and generally involves testing the signal quality, the noise susceptibility, and the operational speed of the memory module as a single unit. The second test phase may also include checking for bit failures in individual memory chips. The third phase is usually carried out by the system manufacturer. During the third phase, the interaction of the memory subsystem with other components in the system is tested. During the third phase, the individual memory module operation is also tested again and the memory array is checked for defects. Because of the significant amount of testing that memories undergo during the manufacturing process, there is generally substantial test cost and test time associated with ensuring the proper memory operation. This test cost and test time translate into an increase in system cost and a decrease in system performance.

There are a number of memory test methodologies that employ either external test hardware, embedded self-test logic ("MBIST"), or both. However, the usefulness of these test methodologies is limited due to the high cost and other limitations associated with them. For instance, external test hardware such as automatic test equipment ("ATE") is very expensive. Moreover, the development time and cost associated with implementing MBIST is relatively high. These costs and limitations are especially significant when testing dynamic random access memory ("DRAM"). For example, technological developments, such as increases in DRAM speed, may require manufacturers to upgrade ATE machines relatively frequently. In addition, MBIST in DRAM chips generally cannot be fully utilized for system level testing of memory boards.

Because of the increasing cost, complexity, and time involved with fully testing DRAM chips, DRAM manufacturers often provide "effectively tested" ("ETT") DRAM chips to memory module manufacturers at a lower price rather than providing fully tested DRAM chips. Memory module manufacturers often prefer the ETT DRAM chips mainly due to their greater availability. Memory module manufacturers who receive ETT DRAM chips then have to assume a part of the responsibility of validating the DRAM chips, adding to the complexity of the memory module test process.

SUMMARY

A memory module is operable in a computer system to communicate data with a system memory controller via a system memory bus. In certain embodiments, the memory module comprises a plurality of memory devices mounted on a circuit board, a data module mounted on the circuit board and coupled between the plurality of memory devices and the system memory bus, and a control module mounted on the circuit board and coupled to the data module, the plurality of memory devices, and the system memory bus. The data module includes a plurality of data handlers in a plurality of integrated circuits. The plurality of memory devices has a specified operating speed and includes address and control ports and data ports.

According to certain embodiments, the memory module is operable in any of a plurality of modes, including a first mode and a second mode. The control module in the first mode is configured to receive system address and control signals from the system memory controller and to output first memory address and control signals to the address and control ports of the plurality of memory devices according to the system address and control signals. The data module in the first mode is configured to propagate one or more first data signals between the data ports of the plurality of memory devices and the system memory controller. The one or more first data signals are output or received at the specified operating speed by at least some of the plurality of memory devices in response to the first memory address and control signals. The data module in the second mode is configured to isolate data paths from the system memory bus to the plurality of memory devices and to output one or more second data signals to the data ports of the plurality of memory devices. The data module in the second mode is further configured to receive one or more third data signals from the plurality of memory devices, to compare the one or more third data signals with expected data, and to output comparison results.

According to certain embodiments, the one or more second data signals are output by the data module at the specified operating speed, and have signal characteristics that correspond to signal characteristics of data signals received by the memory module during the first mode.

DETAILED DESCRIPTION

Figure 1:
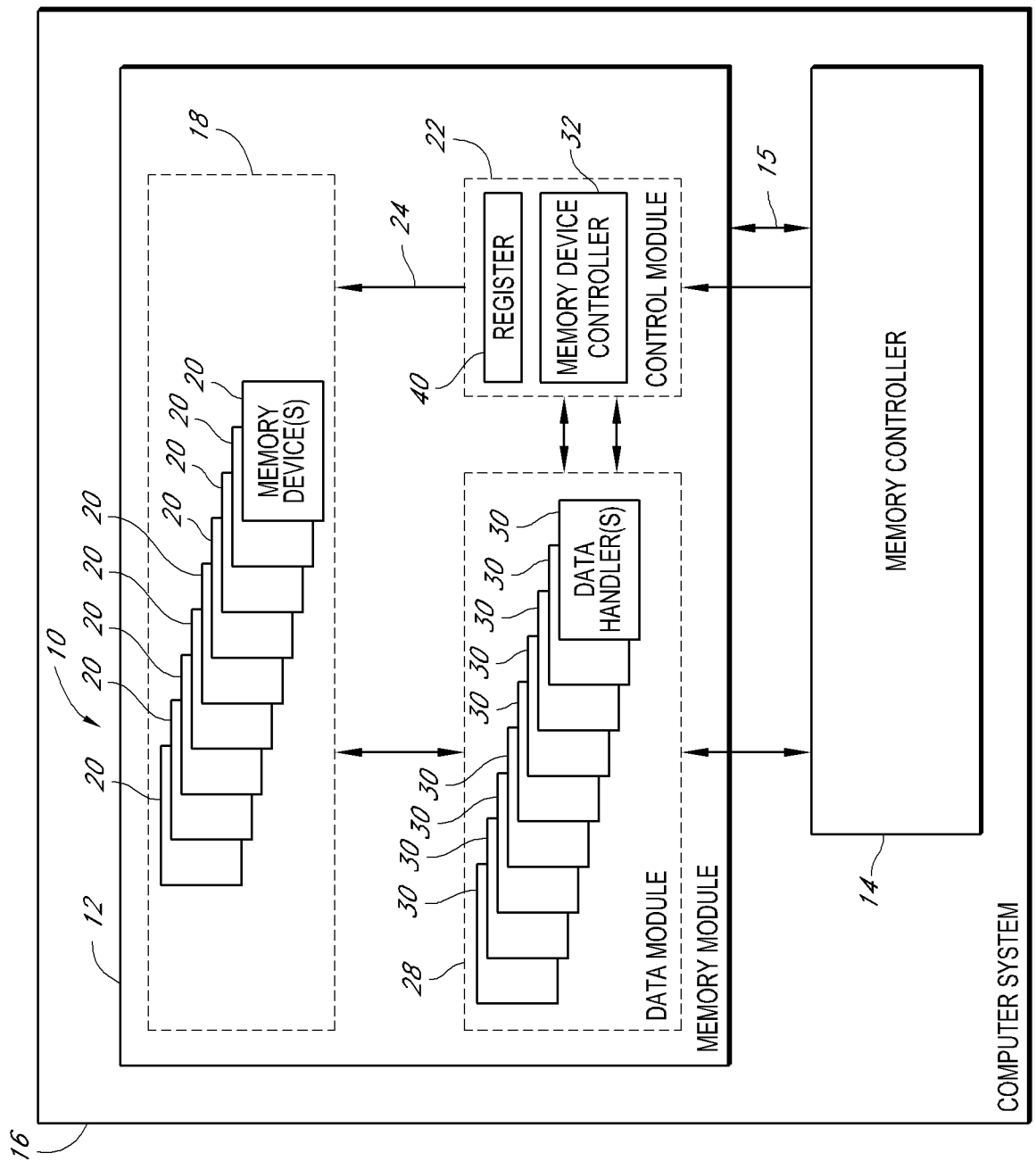
FIG. 1 is a block diagram of an example self-testing memory module in accordance with certain embodiments described herein.

Certain embodiments described herein present a self-testing electronic system, such as for example, a self-testing electronic memory module. Some embodiments described herein present a self-testing memory module that is populated with ETT DRAM chips. Certain embodiments described herein present a self-testing registered dual in-line memory module ("RDIMM"). Some embodiments described herein present a self-testing RDIMM that does not require any additional pins other than the pins on the standard JEDEC RDIMM connector. For example, the memory module may utilize the address and control signals (e.g., address and control signals generated by the memory module to test the memory module) along with a test signal to enable and execute a self testing function.

Certain embodiments described herein present a self-testing memory module that includes a control module and a data module which can generate memory addresses and data according to the JEDEC standard memory protocol.

Some embodiments described herein presents a self-testing memory module that can be configured through an I²C interface and that allows test results to be read out through the I²C interface. Certain embodiments described herein present a self-testing memory module that allows a test function to be configured, controlled, and/or executed without substantial system memory controller involvement. Some embodiments present a self-testing memory module that can be tested without any external test equipment. For example, certain embodiments present a self-testing memory module that can be tested without any system driven test procedure. Various embodiments described herein present a self-testing memory module that can be self-tested at a target system speed. Certain embodiments described herein present a self-testing memory module that can generate data (DQ) and data-strobe (DQS) signals with wave characteristics that resemble the wave characteristics of DQ and DQS signals from a system memory controller.

MBIST is commonly used to test memories embedded in application specific integrated circuits ("ASICs") or system on chip integrated circuits ("SoCs") such as, for example, advanced memory buffers ("AMBs"). The MBIST implementation usually includes three distinct functional blocks: the address/control generator, the data generator/checker (sometimes referred to as a signature analyzer), and the test interface controller/register ("JTAG"). The test instructions and test patterns are generally loaded to the address/control generator and the data generator/checker through the JTAG interface. The test results are generally read out through the JTAG interface.

In memory module applications, there are obstacles associated with using MBIST. One of these obstacles is the large number of signals used to interface the three MBIST functional blocks. The inter-block timing constraints can present another obstacle. In addition, the ability to control the test is limited. For example, synchronizing the address/or control signals with the data signal can be difficult. The relatively large amount of information to be gathered and stored while testing the memory presents yet another obstacle.

Unlike on an ASIC, in which the three MBIST functional blocks are in a single chip, the MBIST functional blocks on a memory module generally would be segregated into multiple chips on the memory module due to physical and electrical limitations and requirements. This makes implementing MBIST on a memory module difficult because, while there is virtually no limit on the number of available interface signals among the three MBIST functional blocks in an ASIC, the memory module can support only a limited amount of interface signals between memory chips. In addition, because the MBIST functional blocks are spread out to multiple chips on a memory module, the inter-block signal delay is generally much longer on a memory module than on an ASIC. It is also generally not feasible to implement cross-checking logic that operates the three MBIST functional blocks in lock-operational block. This is due to the limitation on the number of interface signals and to the relatively long inter-block signal delay time on a memory module versus on an ASIC.

In some cases such as where a memory module includes an AMB, the self-test logic (MBIST) implemented in the AMB includes command and address generation logic in addition to a data generator and checker. Each of these functional blocks may be implemented on a single physical AMB device (e.g., a single integrated circuit package). However, because all of the self-test command, address and data signals are combined in one physical area of the memory module, a memory module (e.g., DIMM) level routing problem can occur, making it difficult to route the self-test signals on the memory module and resulting in performance degradation and/or implementation difficulty. In addition, the data width of self-test logic of the memory module will be limited to the data width of the AMB (e.g., to the data width of the self-test logic implemented on the AMB, to the number of available ports on the AMB, etc.). As such, implementing memory module test logic on an AMB is not flexible (e.g., to changes in the data width of the memory module) and generally supports only memory modules having certain predetermined, fixed data widths.

Finally, in most cases, since an ASIC cannot be repaired, the ASIC MBIST is generally only capable of detecting and reporting the pass/fail status of memory tests. For memory module test results, on the other hand, it is generally advantageous to include both addresses of the memory locations where failures occur and the data patterns that were read back from the failed memory locations. This type of reporting can help to facilitate the repair of the memory module by, for example, allowing for the identification and replacement of failed components.

FIG. 1 is a block diagram of an example self-testing memory module 10 in accordance with certain embodiments described herein. The memory module 10 includes a printed circuit board 12 configured to be operatively coupled to a memory controller 14 of a computer system 16. The memory module 10 further includes a plurality of memory devices 18 on the printed circuit board (PCB) 12, each memory device 20 of the plurality of memory devices 18 comprising data, address, and control ports. The memory module 10 comprises a control module 22 configured to generate address and control signals 24 for testing the memory devices 18. The memory module 10 also includes a data module 28 comprising a plurality of data handlers 30. Each data handler 30 is operable independently from each of the other data handlers 30 of the plurality of data handlers 28 and is operatively coupled to a corresponding plurality of the data ports of one or more of the plurality of memory devices 18. For example, each of the data handlers 30 may be operatively coupled to (e.g., logically and/or electrically coupled to) the corresponding plurality of data ports. Each data handler 30 is further configured to generate data for writing to the corresponding plurality of data ports. The memory module 10 may further include an I²C interface 15 in certain embodiments.

As described more fully below, in certain embodiments the data module 28 generates test data patterns to write to the plurality of memory devices 18 of the memory module 12 and checks the data patterns read or received back from the plurality of memory devices 18 for agreement with corresponding data patterns that are expected to be read back from the plurality of memory devices 18. For example, in one embodiment, the data module 28 generates cyclic patterns to write to the plurality of memory devices 18. In some embodiments, the data module 18 also isolates the data path from the system board of the computer system 16 to the plurality of memory devices 18 while the memory module 10 is not accessed by the computer system 16. For example, the data module 28 may isolate the data path from the system board to the plurality of memory devices 18 when the memory module 10 is in a self-testing mode. The control module 22 may include, for example, a dual input register (e.g., the memory device controller 32 described more fully below) for registering address and control signals coming from either self-testing logic (e.g., from the test controller 36 described more fully below) or from the memory controller 14 on the system board. In some embodiments, during testing, the control module 22 generates address and control signals 24 associated with memory locations to be tested and the data module 28 generates corresponding test data patterns and provides them to the appropriate memory devices 20. For example, the data module 28 may receive a write command from the control module 22 and provide data to be written to certain locations in the memory devices 20 during a write operation. The data module 28 may then receive a read command to read back the data from those locations and check the read data for agreement with the expected data. If there is a mismatch between the read data and the expected data, the data module 28 may, for example, store the failure information (e.g., the failed data word) and inform the control module 22 about the failure. The control module may save the address of the memory location where the failure occurred.

In certain embodiments, the memory module 10 is configured to be operated in a test mode in which the control module 22 selectively inputs the address and control signals to the address and control ports of the plurality of memory devices 18. Moreover, in the test mode, each of the data handlers 30 write the data generated by the data handler 30 to the corresponding plurality of data ports by selectively inputting data signals to the data ports of the plurality of memory devices 18. The data module 28 and/or the control module 22 of certain embodiments are configured to test the plurality of memory devices 18 at the normal operating speed of the memory devices 20. For example, the data module 28 and/or the control module 22 are configured to provide memory signals (e.g., data, address and control signals) according the operating specification of the memory devices 20. In some embodiments, the control module 22 and the data module 28 produce memory addresses, control and/or data signals according to the JEDEC standard memory protocol. In some embodiments, for example, the control module 22 and the data module 28 generate the memory interface signals with proper edge relationships based on the JEDEC standard. In certain embodiments, the test speed, for example, may be defined by the speed of the clock (e.g., the system clock). The address sequences and/or the data patterns of certain embodiments may be programmable either through the I²C interface or they may be defaulted to pre-defined values.

In certain embodiments, data module 28 is configured to generate data signals with programmable slew rates and/or with variable peak values. In one embodiment, for example, the data module 28 is also able to generate data (DQ) and data-strobe (DQS) signals with programmable slew rates and programmable peak values so that the characteristics of the signals generated by the data module 28 generally correspond to the characteristics DQ and DQS signals generated by the system memory controller 14.

In some embodiments, the data module 28 and/or the control module 22 are configured to test the plurality of memory devices 18 under non-normal conditions. For example, the data module 28 and/or control module 22 may be configured to provide signals having frequencies which are higher or lower than the normal operating frequencies of the memory devices 20.

In certain embodiments, the memory module 10 has a memory capacity of 512-MB, 1-GB, 2-GB, 4-GB, or 8-GB. Other memory capacities are also compatible with certain embodiments described herein. In addition, memory modules 100 having widths of 4 bytes, 8 bytes, 16 bytes, 32 bytes, or 32 bits, 64 bits, 128 bits, 256 bits, as well as other widths (in bytes or in bits), are compatible with embodiments described herein. In certain embodiments, the PCB 12 has an industry-standard form factor. For example, the PCB 12 can have a low profile (LP) form factor with a height of 30 millimeters and a width of 133.35 millimeters. In certain other embodiments, the PCB 12 has a very high profile (VHP) form factor with a height of 50 millimeters or more. In certain other embodiments, the PCB 12 has a very low profile (VLP) form factor with a height of 18.3 millimeters. Other form factors including, but not limited to, small-outline (SO-DIMM), unbuffered (UDIMM), registered (RDIMM), fully-buffered (FBDIMM), mini-DIMM, mini-RDIMM, VLP mini-DIMM, micro-DIMM, and SRAM DIMM are also compatible with certain embodiments described herein. For example, in other embodiments, certain non-DIMM form factors are possible such as, for example, single in-line memory module (SIMM), multimedia card (MMC), and small computer system interface (SCSI).

In certain embodiments, the plurality of memory devices 18 of the memory module 10 may be arranged as ranks, each rank of memory generally having a bit width. In certain embodiments, each rank may comprise an independent set of memory devices 20 of the plurality of memory devices 18 that can be accessed by the memory controller 14 to access the full bit-width of the memory bus of the memory module 10. For example, a memory module 10 in which each rank of the memory module is 64 bits wide is described as having an "x64" organization. Similarly, a memory module 10 having 72-bit-wide ranks is described as having an "x72" organization. The number of memory devices 20 and corresponding memory capacity of a memory module 10 can be increased by increasing the number of memory devices 20 per rank or by increasing the number of ranks. For example, a memory module with four ranks with each rank having N 512-MB memory devices 20 has double the memory capacity of a memory module with two ranks with each rank having N 512-MB memory devices 20 and four times the memory capacity of a memory module with one rank with each rank having N 512-MB memory devices 20. During operation, the ranks of a memory module 10 may be selected or activated by control signals that are received from a component of the system (e.g., a system memory controller 14 or a local memory controller of the memory module 10). Examples of such control signals include, but are not limited to, rank-select signals, also called chip-select signals. In certain other embodiments, the memory module 10 comprises only one rank of memory devices 20.

As discussed, the PCB 12 may include at least one connector (not shown) configured to operatively couple the memory module 10 to the memory controller 14 of the computer system 16. The computer system 16 may include a host computer system. For example, the memory module is electrically coupled, logically coupled, or both, with the memory controller 14. Examples of host computer systems 108 include, but are not limited to, blade servers, 1U servers, personal computers (PCs), data storage systems and other applications in which space is constrained or limited. The memory controller 14 may comprise a disk controller of the computer system 16, for example. The memory controller 14 may be mounted on a system board of the host computer 16. The connector can comprise a plurality of edge connections which fit into a corresponding slot connector of the host system 16. The connector of certain embodiments provides a conduit for power voltage as well as data, address, and control signals between the memory module 10 and the host system 16. For example, the connector can comprise a standard DDR2, DDR3, and other future generation edge connectors. Additionally, in certain embodiments, more than one memory module 10 is coupled to the host system 16.

The plurality of memory devices 18 on the PCB 12 may include one or more volatile memory components. For example, the plurality of memory devices 18 of certain embodiments comprises two or more dynamic random-access memory (DRAM) elements 20. Types of DRAM devices 20 compatible with certain embodiments described herein include, but are not limited to, DDR, DDR2, DDR3, and synchronous DRAM (SDRAM). The memory devices 18 may comprise other types of memory elements such as static random-access memory (SRAM). In addition, volatile memory devices 20 having bit widths of 4, 8, 16, 32, as well as other bit widths, are compatible with certain embodiments described herein. Memory devices 20 compatible with certain embodiments described herein have packaging which include, but are not limited to, thin small-outline package (TSOP), ball-grid-array (BGA), fine-pitch BGA (FBGA), micro-BGA (μBGA), mini-BGA (mBGA), and chip-scale packaging (CSP). The plurality of memory devices 18 may further include one or more non-volatile memory devices 20, such as, for example, flash memories. The plurality of memory devices 18 of certain embodiments may include both volatile and non-volatile memory devices 20. For example, the plurality of memory devices 18 may include one or more of DRAM, SRAM, and/or flash memory devices in some embodiments.

Each data handler 30 is operable independently from each of the other data handlers 30 of the plurality of data handlers 28. For example, each data handler 30 is configured to write to and/or read from the corresponding plurality of data ports of one or more of the memory devices 20 without being in communication any of the other data handlers 30 or other data ports of the memory devices 20. As such, each data handler 30 can be used to generally independently test a portion of the memory space of the memory module 10. For example, each data handler 30 may be used to independently test one memory device 20 of the memory module 10. In such a configuration, the corresponding plurality of data ports of each data handler 30 may comprise each data port of the corresponding memory device 20. In other embodiments, each data handler 30 may be used to test a segment of one memory device 20, more than one memory device 20, segments more than one memory device 20, or any combination or sub-combination thereof. Because each of the data handlers 30 is operable independently of each of the other data handlers 30, the data handlers 30 are generally modular. As such, modifications in the configuration of the memory module 10 (e.g., changes in the bit-width of the memory bus, changes in the number of memory devices 20, etc.) may be less complicated to accommodate than in other types of self-testing memory modules 10. For example, where a new memory device 20 or set of memory devices 20 is added to the memory module 10, the change may be generally accommodated by adding a corresponding data handler 30. The change may be accommodated without having to implement a major reorganization of the memory module 10 or the self-testing logic of the memory module 10, for example.

Figure 2:
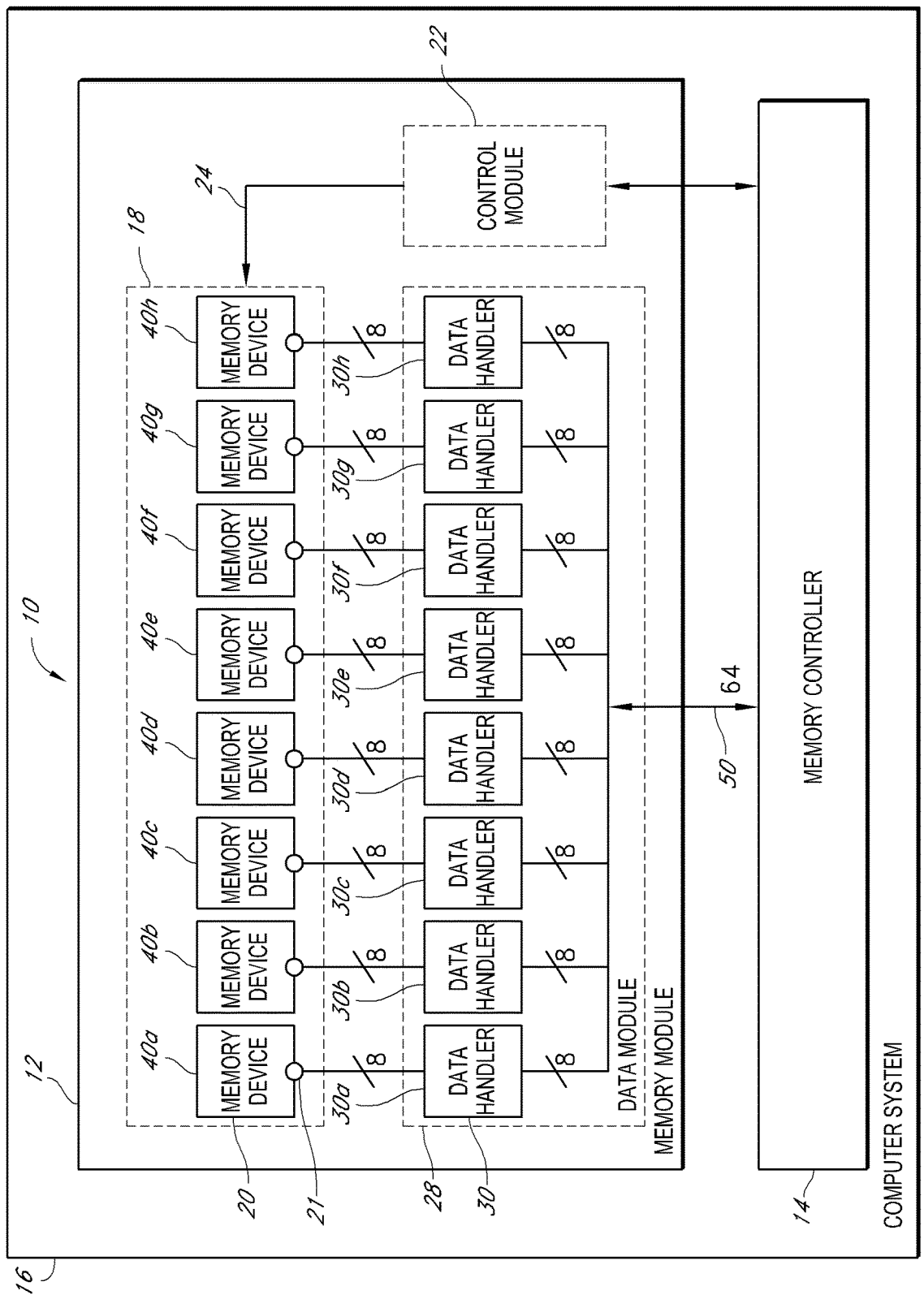
FIG. 2 is a block diagram of an example self-testing memory module including eight memory devices and eight data handlers in accordance with certain embodiments described herein.

Each data handler 30 is further configured to generate data for writing to the corresponding plurality of data ports. FIG. 2 is a block diagram of an example self-testing memory module 10 including eight memory devices 20 (e.g., memory devices 40a-40h) and a data module 28 comprising eight data handlers 30 (e.g., data handlers 30a-30h) in accordance with certain embodiments described herein. Each of the memory devices 20 includes an eight bit output data word and eight corresponding data ports. In addition, the system memory bus 50 between the memory controller 14 and the example memory module 10 is 64 bits wide and each of the data handlers 30 receives an eight bit segment of the system memory bus 50. Each of the data handlers 30 is operatively coupled to a corresponding plurality of data ports 21 of a corresponding one of the memory devices 20. As such, the data handlers 30 may be operatively coupled (e.g., electrically and/or logically coupled or connected) to the eight data ports 21 of one of the corresponding memory devices 20. For example, the data handler 30a may be operatively coupled to the eight data ports 21 of the memory device 40a of FIG. 2.

The configuration shown in FIG. 2 is for the purposes of illustration and is not intended to be limiting. For example, while the example memory module 10 of FIG. 2 includes an equal number of memory devices 20 and data handlers 30, other configurations are possible. In some configurations there are more memory devices 20 than data handlers 30 or vice versa. Moreover, the one or more data handlers 30 may be operatively coupled to a subset of the data ports 21 of one the memory devices 20 instead of all of the data ports 21 of one of the memory devices 20. In other embodiments, one or more data handlers 30 may be operatively coupled to a subset or all of the data ports 21 of more than one of the memory devices 20. For example, in one embodiment, each of the data handlers 30 are operatively coupled to all of the data ports of two memory devices 20.

In certain embodiments, the plurality of data handlers 28 comprises at least two physically separate components mounted on the PCB 12. For example, the plurality of data handlers 28 may include at least two physically separate integrated circuit packages. The physically separate integrated circuit packages are mounted on different portions of the PCB 12 in some embodiments. For example, each of the eight data handlers 30a-30h shown in FIG. 2 may include physically separate integrated circuit packages mounted on different portions of the PCB 12. While eight data handlers 30 are shown in FIG. 2, other numbers of data handlers 30 are possible including fewer or more than eight.

In certain embodiments, each of the plurality of data handlers 30 is positioned on the PCB 12 proximate to the corresponding plurality of data ports. For example, each data handler 30 of certain embodiments is positioned closer to the corresponding plurality of data ports 21 than the data handler 30 is to the other data ports 21 of the plurality of memory devices 18. For example, the data handler 30a is positioned closer to the corresponding plurality of data ports 21 of the memory device 40a than to the other data ports 21 of the other memory devices 40b-40h.

Figure 3:
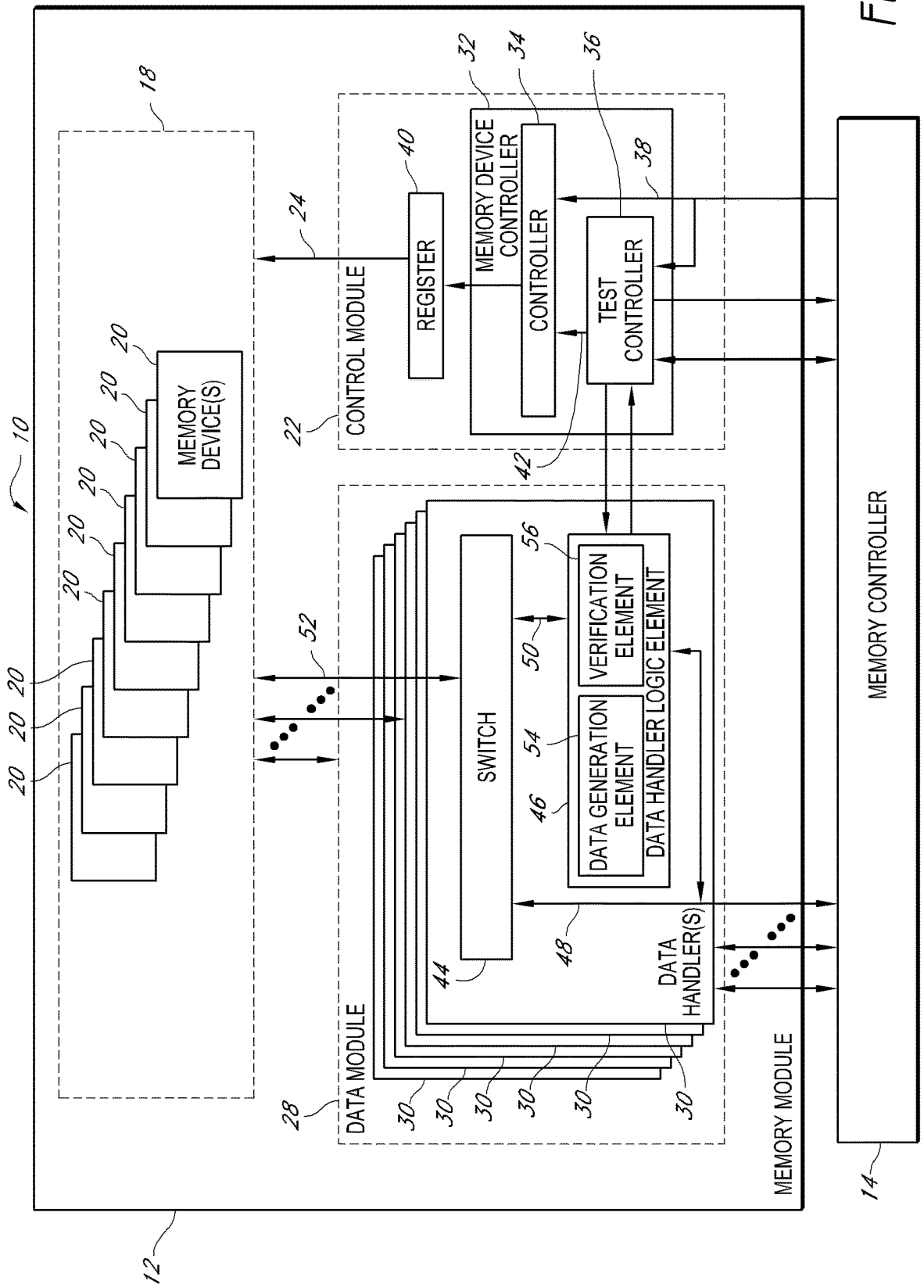
FIG. 3 is a block diagram of an example data handler module and an example control module in accordance with certain embodiments described herein.

FIG. 3 is a block diagram an example data module 28 and an example control module 22 in accordance with certain embodiments described herein. The control module 22 can be configured to generate address and control signals 24 for testing the plurality of memory devices 18. In some embodiments, the control module 22 includes a control mixer element 32. The control mixer element 32 may include a memory device controller 34 (e.g., a DRAM controller) and a test controller 36. In certain embodiments, the control mixer element 32 generally controls the address and the control signals for the self-testing function.

In certain embodiments, the memory device controller 34 generally pre-processes address and control information before it sends the information to a register 40. In one embodiment, the memory device controller 34 receives signals 38 (e.g., address and control signals) from the system memory controller 14 and signals 42 (e.g., address and controls signals) from the test controller 36. The control module 22 of certain embodiments is configured to selectively input to the address and control ports of the plurality memory devices 18 either the address and control signals 38 from the system memory controller 14 or the address and control signals 42 from the control module 22 (e.g., from the test controller 36). For example, the memory device controller 34 may send either the signals 38 from the system memory controller 14 or, alternatively, the signals 42 from the test controller 36, to the register 40 depending on whether the memory module 10 is in normal (non-test) mode or in a test mode, respectively. In one embodiment, the memory device controller 34 generates the address and control signals for memory device (e.g., DRAM device) operations. The test controller 36 controls the generation of the address and control signal sequences to be used during the self-testing operation of the memory module 10 and also communicates with the data module 28. The control module 22 may be implemented in the control register of the memory module 10 in certain embodiments. In various embodiments, the control module 22 includes discrete logic, one or more application-specific integrated circuit (ASICs), one or more microprocessors, one or more field-programmable gate arrays (FPGAs), or one or more computer-programmable logic device (CPLDs).

The data module 28 and the subcomponents thereof (e.g., the data handlers 30) may be in communication with one or more of the memory devices 20, the control module 22, and the memory controller 14. In certain embodiments, the data module 28 comprises a plurality of data handlers 30. In other embodiments the data module 28 includes at least one data handler 30. Each of the data handlers 30 of certain embodiments comprises a switch 44. For example, the switch 44 may include a data multiplexer/demultiplexer ("data mux/demux"). The switch 44 may provide a bi-directional data multiplexer function. In certain embodiments, the switch 44 is configured to selectively input to the corresponding plurality of data ports either data signals 48 from the system memory controller 14 or data signals 50 from the data handler logic element 46. The switch 44 of certain embodiments may further be configured to receive data signals 52 (e.g., during a read operation) from the plurality of memory devices 18 and to propagate the data signals 52 to the data handler logic element 46 and/or the memory controller 14. In some embodiments, for example, the switch 44 selectively inputs the data signals 48 to be written to the plurality of memory devices 18 from the system memory controller 14 when the memory module 10 is a normal (non-test mode) mode and, alternatively, inputs the data signals 50 from the data handler logic element 46 during a test mode. While the switch 44 is shown as being included in the data handler 30 in the example of FIG. 3, other configurations are possible. For example, in other embodiments the switch 44 may be logically and/or physically separated from the data handler module 28 and/or the data handlers 30.

Each of the data handlers 30 of certain embodiments further includes a data handler logic element 46. The data handler logic element 46 of certain embodiments comprises a data generation element 54 and a verification element 56. The data generation element 54 may be configured to generate data signals (e.g., patterns of data signals) for writing to the corresponding plurality of data ports, for example. The data signals and/or patterns of data signals may be based on information (e.g., programming or configuration information) the data handler logic element 46 receives from the control module 22, for example. The data may be cyclic data in some embodiments or non-cyclic data in other embodiments. For example, the cyclic data may comprise at least one predetermined pattern of data which repeats or is cycled two or more times. In various embodiments, the data comprises one or more incrementing patterns or decrementing patterns, for example. In other embodiments, the data comprises a pattern which alternates each bit on successive memory writes. For example, a memory write comprising one or more hexadecimal "A" characters (each corresponding to a four-bit binary word of "1010") may be followed by a memory write comprising one or more hexadecimal "5" characters (each corresponding to a four-bit binary word of "0101"). The data may be generated in a variety of ways. In one embodiment, the data is generated based on a current write address value. For example, in one example configuration, on a first write cycle, hexadecimal "A's" are generated and written to even address locations and hexadecimal "5's" are generated and written to odd address locations, and on a second write cycle, "5's" are written to even addresses and "A's" are written to odd addresses, and this pattern repeats in subsequent cycles. The data may be generated based previously written data (e.g., inverting each of the bits of a previously written data word) in some embodiments. In general, any manner of generating a cyclic or otherwise deterministic data pattern may be compatible with embodiments described herein. In other embodiments, random or pseudorandom data may be generated and written to the corresponding plurality of data ports. For example, a linear feedback shift register (LFSR) may be used in some embodiments. In addition, the data patterns may be programmable. For example, the data patterns may be programmable based on information received by the data generation element 54 from the memory controller 14 (e.g., through the control module 22), or from the control module 22.

The plurality of data handlers 30 are further configured to read data from the corresponding plurality of data ports. For example, the verification element 56 may be configured to receive data from the corresponding plurality of data ports (e.g., through the switch 44 during a test mode). The verification element 56 may further be configured to check for failures in the operation of the plurality memory devices 18 by verifying that data read from the corresponding plurality of data ports corresponds to the data generated by the data handler 30 and written to the corresponding plurality of data ports.

In certain embodiments, the verification element 56 is configured to perform the verification without storing a copy of the data written to the corresponding plurality of data ports or accessing a stored copy beyond the data read from the plurality of memory devices 18. For example, the verification element 56 does not store or access a copy of the data that is written to the corresponding plurality of data ports except for the data stored and read back from the plurality of memory devices 18. As such, the memory module 10 of certain embodiments advantageously does not require separate memory for storing duplicate copies of test data that is written to the plurality of memory devices 18 for later comparison. For example, the verification element 56 may calculate comparison data and may compares the comparison data to the data read from the corresponding plurality of data ports. In certain embodiments, the comparison data comprises data which expresses the data or values expected to be received from the plurality of memory devices 18 if the write, store, and read processes of the data using the data module 28 and the plurality of memory devices 18 are performed correctly or as expected. The calculation may be performed simultaneously or substantially simultaneously with receiving the data read from the corresponding plurality of data ports in certain embodiments. In other embodiments, the calculation is performed either before or after receiving the data. Other configurations are possible. For example, in one embodiment, the verification element 56 does store a separate copy of the data written to the corresponding plurality of data ports upon writing the data and compares the separate copy to the read data received from the plurality of memory devices 18.

The verification element 56 of certain embodiments calculates the comparison data based on the cyclic data. For example, in one embodiment, the verification element 56 calculates the comparison data in substantially the same manner that the data generation element 54 generates the data as described above (e.g., based on a current write address, using an LFSR, etc.). As such, the comparison data of certain embodiments is substantially a repeat of the data written. In one example embodiment, the data handler 30 is configured (e.g., is programmed by the control module 22) to write an alternating series of "A's" and "5's" to the data ports of the corresponding plurality of data ports as described herein. For example, the data handler 30 may be configured to write one or more "A's" to the first address location of an N-word memory device 20 including the corresponding plurality of data ports. The data handler 30 may then write one or more "5's" to the second address location, one or more "A's" to the third address location and so on until the data handler 30 has written to all N memory locations. The verification element 56 of the example embodiment then calculates the comparison data based on the cyclic data written to the corresponding plurality of data ports. For example, the verification element 56 calculates a comparison word including one or more "A's", "5's," and "A's," respectively, to be compared to the data read from the first, second, and third address locations based on the cyclic data (e.g., based on the known cycle of the data). In some embodiments, the comparison data is calculated based on a current read address.

In certain embodiments, data associated with failures in the operation of the plurality of memory devices 18 are stored in the data module 28. For example, data read from the corresponding plurality of data ports which do not correspond to (e.g., match) the comparison data calculated by the verification element 56 may be stored in the data module. Moreover, in some embodiments, memory addresses associated with the failures in the operation of the plurality of memory devices 18 are stored in the control module 22. For example, the data handler 30 may communicate data failures (e.g., when data read from the corresponding plurality of data ports does not correspond to calculated comparison data) to the control module 22 which may then store the addresses corresponding to the data failure. In certain embodiments, the memory module 12 is configured to report failures (e.g., the failed data, the address corresponding to the memory location of the failed data, and/or expected data) via the I$^2$C interface 15 to the memory controller 14. In addition, in certain embodiments the test controller 36 and/or the data handlers 30 may be updated through the I$^2$C interface 15 with new data patterns and/or with alternative memory access sequences to conduct AC tests (e.g., tests of the power, current, I/O speed, etc.).

In various embodiments, the components of the data module 28 (e.g., the switch 44, the data handlers 30, the data handler logic element 46, the data generation element 54, and/or verification element 56) may include discrete logic, one or more application-specific integrated circuits (ASICs) one or more microprocessors, one or more field-programmable gate arrays (FPGAs), or one or more computer-programmable logic devices (CPLDs). Additionally, one or more of the various functional blocks (e.g., the switch 44) of the data module 28 of FIG. 3 may not be included. In some embodiments, additional functional blocks may be included. Moreover, some of the functional blocks are described as separate functional blocks for illustration purposes and may comprise one physical component. For example, in one embodiment, each of the data handlers 30 and the corresponding switch 44, data generation element 54, and verification element 56 comprise one physical component (e.g., are included in one integrated circuit package). In another embodiment, the data module 28 comprises one physical component.

Referring again to FIG. 1, a self-testing memory module 10 of certain embodiments comprises a printed circuit board (PCB) 12 and is configured to be operatively coupled to a memory controller 14 of a computer system 16. The memory module 10 further includes a plurality of memory devices 18 on the printed circuit board 12 where each memory device 20 of the plurality of memory devices 18 comprising data, address, and control ports. The memory module 10 further comprises a control module 22 configured to generate address and control signals for testing the plurality of memory devices 18. In certain embodiments, the memory module 10 further comprises a data module 28 comprising at least one data handler 30 and operatively coupled to a corresponding plurality of the data ports of one or more of the memory devices 20. The data handler 30 is configured to generate cyclic data for writing to the corresponding plurality of data ports. In certain embodiments, there may be one data handler 30, for example. In other embodiments, there may be more than one data handler 30. The elements of the memory module 10 may be compatible with any of the embodiments described herein.

Figure 4:
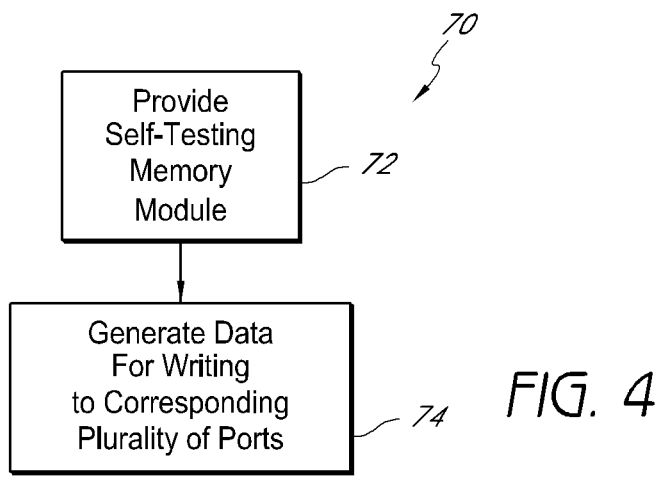
FIG. 4 is a flowchart of an example method of self-testing a memory module in accordance with certain embodiments described herein.

FIG. 4 is a flowchart of an example method 70 of self-testing a memory module 10 in accordance with certain embodiments described herein. While the method 70 is described herein by reference to the memory module 10, other memory modules, electronic systems or subsystems, and/or circuits are also compatible with the embodiments described herein. The method 70 of certain embodiments comprises providing a self-testing memory module 10 at operational block 72. The memory module 10 may comprise a printed circuit board (PCB) 12 configured to be operatively coupled to a memory controller 14 of a computer system 16. The memory module 10 may further comprise a plurality of memory devices 18 on the printed circuit board 12. Each memory device 20 of the plurality of memory devices 18 may comprise data, address, and control ports. The memory module 10 may comprise a control module 22 configured to generate address and control signals for testing the plurality of memory devices 18. The memory module 10 may further comprise a data module 28 comprising a plurality of data handlers 30. In certain embodiments, the data module 28 comprises at least one data handler 30. Each data handler 30 of certain embodiments is operable independently from each of the other data handlers 30 of the plurality of data handlers 28 and is operatively coupled to a corresponding plurality of the data ports. At operational block 74, the method 70 further comprises generating, by each of the data handlers 30, data for writing to the corresponding plurality of data ports.

Figure 5:
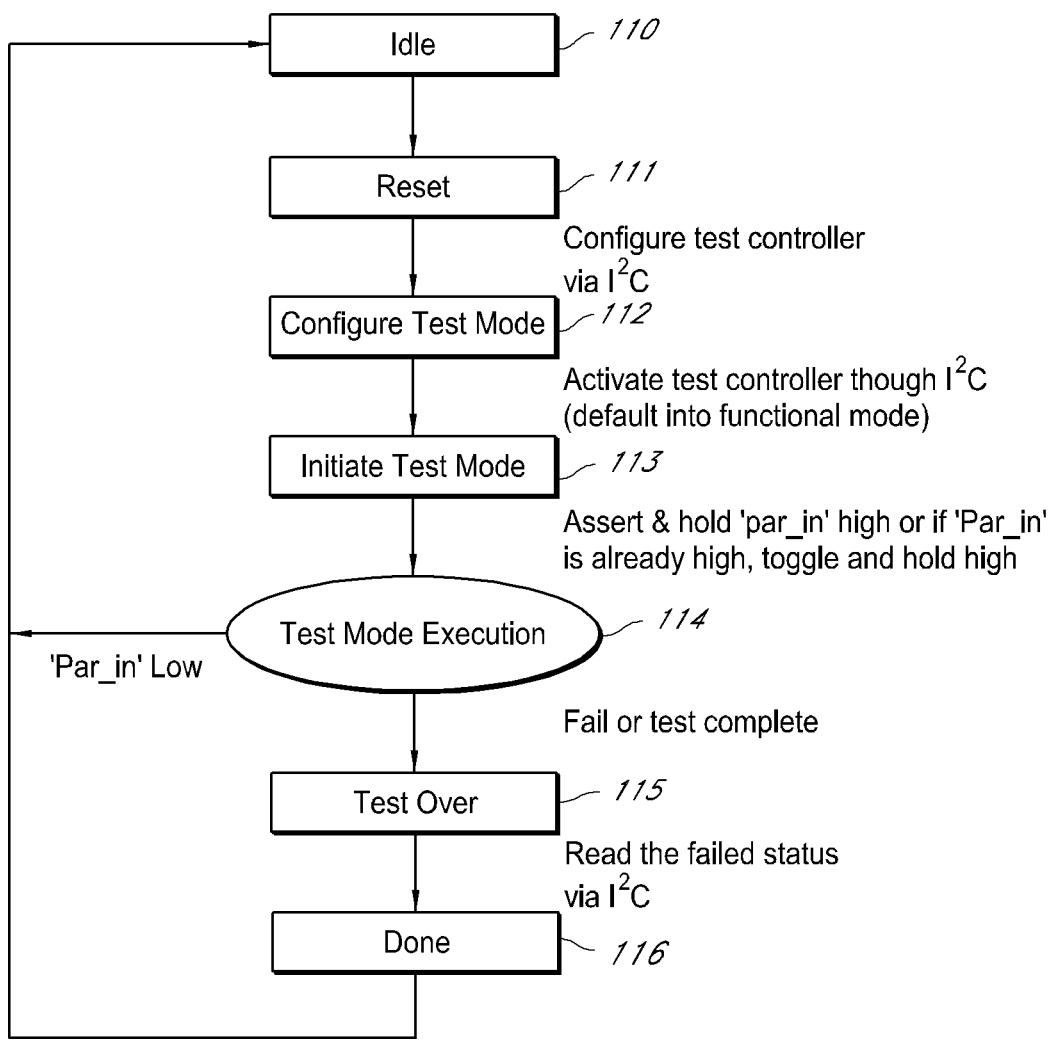
FIG. 5 is a flow diagram illustrating the self-testing operation of an example memory module in accordance with certain embodiments described herein.

FIG. 5 is a flow diagram 100 illustrating self-testing operation of an example self-testing memory module 10 in accordance with certain embodiments described herein. At operational block 110 the memory module 10 enters an idle state after power up or, in some embodiments, when the memory board of the computer system 16 is connected to a mother board or to a test board. In one embodiment, at operational block 110, the contents of the register 40 are undefined and the controllers (e.g., the test controller 36 and the memory device controller 34) are in unknown state. After power up, the memory module 10 is reset (e.g., a reset command is executed) at operational block 111. At operational block 111, the logic of the data handler 30 (e.g., data generation element 54 and/or verification element 56) and the logic of the control mixer 32 are set to default values and/or states. For example, the memory module 10 may default to a non-test mode (e.g., normal operational mode) and the switches 44 of the data handlers 30 and the memory device controller 34 are not configured in a test mode. At operational block 112, the test mode is configured. For example, the computer system 16 (e.g., through the memory controller 14) may configure the test mode. The configuration may be through the I²C interface 15, for example, and may include configuring the test controller 36 for test mode. For example, configuring the test mode may include switching (e.g., by configuring the test controller 36) the mode of the memory module 10 from a normal operation mode to the test mode.

At operational block 113, the test mode is initiated. Initiating the test mode may comprise configuring a particular test case (e.g., particular test data or data patterns, particular write and/or read address sequences, etc.). The initiation may be achieved by activating the test controller 36 to initiate the test mode. For example, at operational block 113, the data handlers 30 and the control mixer 32 are readied (e.g., via a tester) beginning the self-testing of the memory module 10. For example, the tester may comprise an ATM tester, a server, a specialized tester. The tester may ready the data handlers 30 and the control mixer through the I²C interface 15 or through the control signals 38, for example. For example, the data handlers 30 are configured to input data generated by the data handlers 30 to the corresponding plurality of data ports of the plurality of memory devices 18 and the control mixer 32 is configured to input address and control signals from the test controller 36 to the plurality of memory devices 18. At operational block 113 the test controller 36 updates each of the data handlers 30 (e.g., with new data patterns, write signal characteristics, etc.).

In one embodiment, the input signal on a pin (e.g., a parity-in pin) of the memory module 10 is asserted or toggled (e.g., by the memory controller 14). For example, if the parity-in signal ("Par-in") is un-asserted (e.g., set to a "low" value), it is asserted (e.g., set to a "high" value) and held in the asserted state. Alternatively, if the parity-in signal is already in the asserted state, it may be toggled and then held in the asserted state. The memory module 10 executes the test mode (e.g., writes and reads test data patterns) at operational block 114. The memory module 10 continues executing the test mode at operational block 114 until the self-test is complete or until the memory module 10 detects a certain number of memory failures such that a failure count exceeds a preset number.

If the failure count exceeds the preset number, the memory module 10 enters operational block 115 and "errors out" of the test mode. If the self-test is completed at operational block 114 and the failure count does not exceed the preset number, the memory module 10 enters operational block 115. At operational block 115, the memory module 10 sends out a test completion indication signal (e.g., through the test controller 36 to the memory controller 14). At operational block 116, the fail status of the test may be read out through, for example, the I²C interface 15. For example, one or more address values associated with failed memory locations, and/or the data read from those locations, and/or expected data may be read. In other cases, where the test fails, the memory module 10 may report the failure to the memory controller 14 through any available signal (e.g., bidirectional data or data strobe signal) between the memory module 10 and the memory controller 14.

In some embodiments, the memory module 10 is generally interruptible. For example, the memory module 10 may exit the self-test and return to operational block 110 if the signal going into the parity-in pin is, for example, de-asserted or removed at operational block 155. In other embodiments, the interrupt signal or condition may be different and may not be a parity-in signal. For example, in one embodiment, the memory module 10 may exit the self-test and return to operational block 110 if a timer having a pre-determined count expires. When the self-testing is interrupted, the memory module 10 will return to operational block 110 and the bit failure information in the control mixer 32 and the data handler 30 becomes invalid.

Figure 6:
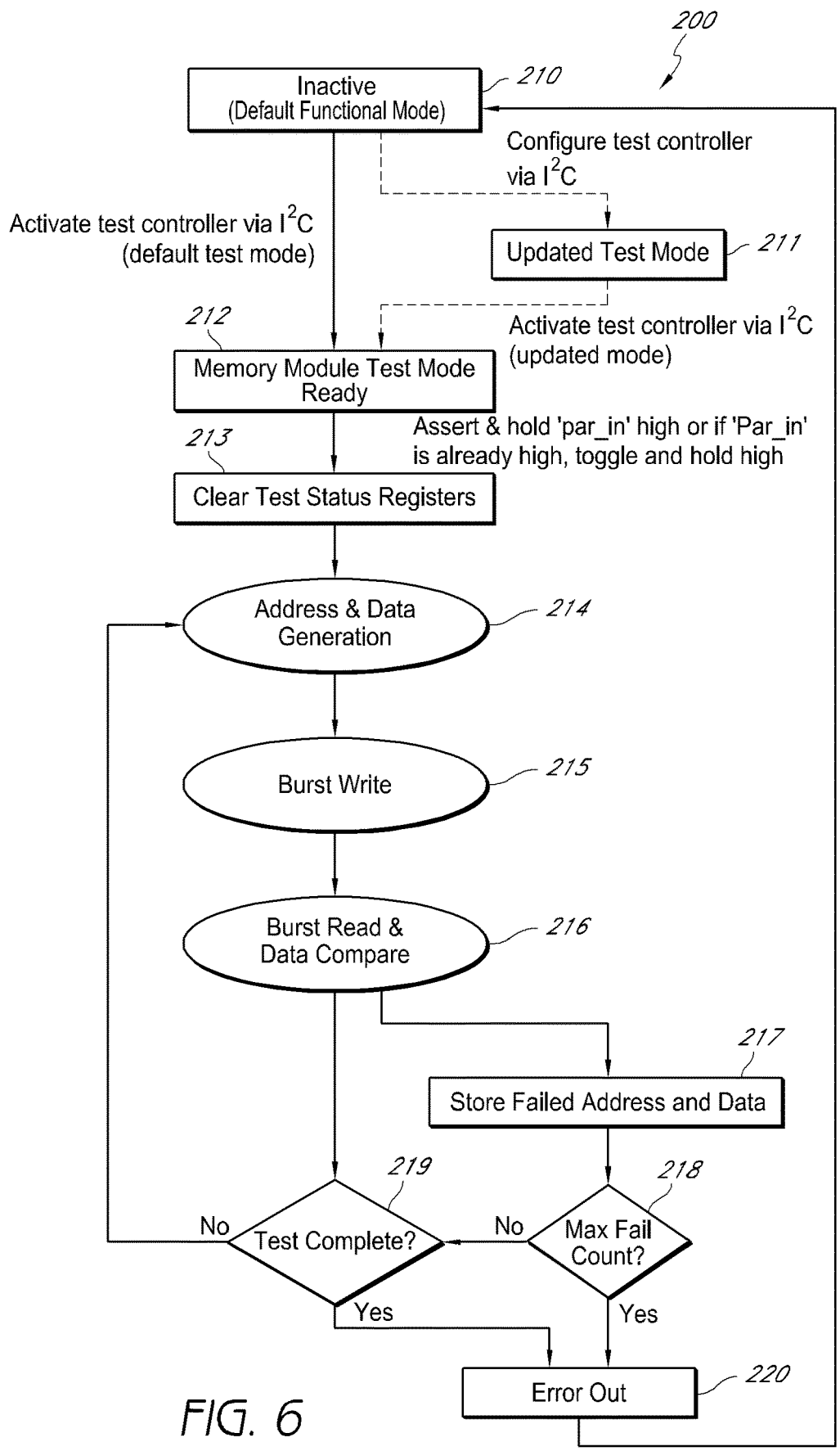
FIG. 6 is a flow diagram illustrating the self-testing operation of an example memory module in accordance with certain embodiments described herein.

FIG. 6 is a flow diagram 200 illustrating the operation of an example self-testing memory module 10 in accordance with certain embodiments described herein. For example, one or more of the operational blocks of the flow diagram 200 of FIG. 6 may correspond to one or more of the operational blocks of FIG. 5. At operational block 210, the memory module 10 may be generally inactive. For example, the testing logic (e.g., the control module 22 and/or the data module 28) may be generally inactive and the memory module 10 may default to a functional (e.g., non-test) mode. In certain embodiments, the memory module 10 executes one or more tasks which configure the self-test mode of the self-testing memory module using an I$^2$C interface 15. For example, the memory module 200 may configure the test controller 36 through the I$^2$C interface 15 (e.g., as described with respect to FIG. 5). In other embodiments, the test mode is configured using the control signals 38. For example, the test mode may be updated at operational block 211 in certain embodiments. In certain embodiments, updating the test mode comprises programming the test controller 36 with test configuration information such as test data patterns, test data sequences, test failure conditions, etc. After updating the test mode at operational block 211, the test controller 36 may then be activated through the I$^2$C interface 15 (e.g., as described with respect to FIG. 5) in certain embodiments. Alternatively, as shown, the test controller 36 may be activated through the I$^2$C interface 15 without first updating the test mode.

At operational block 212, the memory module test mode is ready for execution. In one embodiment, the input signal on a pin (e.g., a parity-in pin) of the memory module 10 is asserted or toggled (e.g., by the memory controller 14). For example, if the parity-in signal is low, it is asserted (e.g., set to a "high" value) and held in the asserted state. Alternatively, if the parity-in signal is already in the asserted state, it may be toggled and then held in the asserted state. At operational block 113, a set of status registers (e.g., one or more registers of the control module 22 or the data module 28) are cleared.

The memory module 200 generates address and data signals for testing the plurality of memory devices 18 at operational block 214. For example, the data generation elements 54 of the data handlers 30 may generate the data for writing to the plurality of memory devices 18 as described herein. In addition, the control module 22 may generate address and control signals for testing the plurality of memory devices 18 as described herein. At operational block 215, the memory module 10 performs a burst write function. For example, in certain embodiments, the memory module 10 writes multiple memory locations in the memory module 10 that are to be tested at operational block 215 in a relatively short amount of time (or in a burst). In certain embodiments, the memory module 10 can perform multiple write bursts at operational block 215. Next, at operational block 216, the memory module 10 performs a read & compare function. For example, in certain embodiments, the memory module 10 reads back certain memory locations at operational block 216 that have been written at operational block 215 and compares the values with certain expected data. For example, a verification element 56 of each of the data handlers 30 may calculate the expected data and/or compare the values as described herein. In some embodiments, the memory module 200 reads from multiple memory locations in the memory module 10 in a relatively short amount of time (or in a burst). In certain embodiments, the memory module 10 can execute multiple read bursts at operational block 216 as it compares the read data with expected data. In some embodiments, the memory module 200 (e.g., the data handlers 30 of the memory module 200) stores any failed read data and the associated expected data at operational block 217. In some embodiments, the memory module sends one or more failure indications to the memory controller 14 over one or more available signals between memory module 10 and the memory controller 14. For example, the I$^2$C interface 15 or one or more bi-directional data pins (e.g., one or more of the data pins 48) may be used.

The memory module 200 stores the addresses of the memory locations associated with the failed read data using the test controller 32 at operational block 217. In other embodiments the failed read data, expected data, and the addresses of the memory locations associated with the failed read data may be stored using the test controller 32. For example, in one embodiment, the test controller 32 stores the failed read data, expected data, and the addresses of the memory locations associated with the failed read data at operational block 217. In some embodiments, the test controller 32 is generally inaccessible through the I$^2$C interface 15 during self-test operation. For example, the test controller is inaccessible through the I$^2$C interface 15 until a test failure occurs at operational block 217 or until the test completes at operational block 219. In some embodiments, when the test is complete, the test results can be read out of the memory module 10 (e.g., through the I$^2$C interface 15). In some cases, the test can be interrupted using the I$^2$C interface 15 or using the parity-in signal (e.g., by de-asserting the parity-in signal).

Although certain preferred embodiments and examples are discussed above, it is understood that the inventive subject matter extends beyond the specifically disclosed embodiments to other alternative embodiments and/or uses of the invention and obvious modifications and equivalents thereof. It is intended that the scope of the inventions disclosed herein should not be limited by the particular disclosed embodiments. Thus, for example, in any method or process disclosed herein, the acts or operations making up the method/process may be performed in any suitable sequence and are not necessarily limited to any particular disclosed sequence. Various aspects and advantages of the embodiments have been described where appropriate. It is to be understood that not necessarily all such aspects or advantages may be achieved in accordance with any particular embodiment. Thus, for example, it should be recognized that the various embodiments may be carried out in a manner that achieves or optimizes one advantage or group of advantages as taught herein without necessarily achieving other aspects or advantages as may be taught or suggested herein.

We claim:

1. A memory module operable in a computer system including a system memory controller coupled to a system memory bus having a bit width N, where N is a positive integer, the memory module comprising:
   a printed circuit board (PCB) including a connector that fits into a corresponding slot connector of the computer system whereby the memory module is operatively coupled to the system memory controller of the computer system via the system memory bus;
   memory devices mounted on the PCB and organized in one or more N-bit-wide ranks, the memory devices having address and control ports and data ports;

a data module coupled to the data ports of the memory devices and to the connector, the data module including a plurality of data handlers in respective physically separate integrated circuit packages mounted on respective portions of the PCB and coupled to respective n-bit-wide segments of the memory devices, where n is a positive integer smaller than N; and a control circuit mounted on the PCB and coupled to the connector, the data module, and address and control ports of the memory devices;

wherein, during a normal memory read or write operation, the control circuit is configurable to receive system address and control signals from the system memory controller via the connector and to output registered memory address and control signals for the normal memory read or write operation, and each respective data handler of the data module is configurable to propagate respective read or write data signals associated with the normal memory read or write operation between a respective n-bit-wide segment of the memory devices and a respective n-bit-wide segment of the system memory bus, the respective read or write data signals being output or received by at least one memory device in the respective n-bit-wide segment of the memory devices in response to the registered memory address and control signals; and wherein, during testing of the memory module, the control circuit is configurable to output test address and control signals, the each respective data handler of the data module is configurable to isolate respective data paths from the memory controller to the respective n-bit-wide segment of the memory devices and to output respective test data signals to the respective segment of the memory devices based on information received from the control circuit, and the respective test data signals including test data to be received by and written into one or more memory devices in the respective segment of the memory devices in response to the test address and control signals from the control circuit.

2. The memory module of claim 1, wherein, during testing of the memory module:

the control circuit is configurable to output verification address and control signals;

the one or more memory devices are configurable to output respective verification data signals in response to the verification address and control signals; and the each respective data handler of the data module is configurable to receive the respective verification data signals, to compare respective verification data in the respective verification data signals with expected data, and to output comparison results.

3. The memory module of claim 2, wherein the expected data are stored in the each respective data handler.

4. The memory module of claim 2, wherein n=8 and N=64 or 72.

5. The memory module of claim 2, wherein the memory devices are dynamic random access memory devices, wherein each memory device is 8-bit-wide, and wherein the at least one memory device includes one respective memory device in one of the one or more ranks.

6. The memory module of claim 2, wherein the memory devices are dynamic random access memory devices, wherein each memory device is 4-bit-wide, and wherein the at least one memory device includes two respective memory devices in one of the one or more ranks.

7. The memory module of claim 2, wherein the each respective data handler of the data module is configurable to generate the respective test data signals with programmable slew rates and programmable peak values so that characteristics of the respective test data signals correspond to characteristics of write data signals from the memory controller.

8. The memory module of claim 2, wherein the memory module is operable at an operational speed according to a system clock, wherein the at least one respective memory device is configurable to output or receive the respective data signals at the operational speed in response to the registered memory address and control signals, and wherein the each respective data handler is configurable to output the respective test data signals at the operational speed in response to a write command from the control circuit.

9. The memory module of claim 1, wherein the data module includes first and second data handlers in first and second integrated circuit packages, respectively, wherein, during the normal memory read or write operation, the first integrated circuit package is configurable to propagate first data signals between a first n-bit-wide portion of the memory devices and a first n-bit-wide segment of the system memory bus, and the second integrated circuit package is configurable to propagate second data signals between a second n-bit-wide portion of the memory devices and a second n-bit-wide segment of the system memory bus independently of and concurrently with the first integrated circuit package propagating the first data signals.

10. The memory module of claim 9, wherein during testing of the memory module, the first integrated circuit package is configurable to write first test data into at least one first memory device by outputting first test data signals, and the second integrated circuit package is configurable to write second test data into at least one second memory device by outputting second test data signals independently of and concurrently with the first integrated circuit package outputting the first test data signals.

11. A method, comprising:

at a memory module operable in a computer system including a system memory controller coupled to a system memory bus having a bit width N, the memory module including: a printed circuit board (PCB) including a connector that fits into a corresponding slot connector of the computer system whereby the memory module is operatively coupled to the system memory controller of the computer system via the system memory bus; memory devices mounted on the PCB and organized in one or more N-bit-wide ranks, where N is a positive integer, the memory devices having address and control ports and data ports; a data module coupled to the data ports of the memory devices and to the connector, the data module including a plurality of data handlers in respective physically separate integrated circuit packages mounted on respective portions of the PCB and coupled to respective n-bit-wide segments of the memory devices, where n is a positive integer smaller than N; and a control circuit mounted on the PCB and coupled to the connector, the data module, and address and control ports of the memory devices;

performing normal memory read or write operations, including: receiving, at the control circuit, system address and control signals from the system memory controller via the connector; outputting, from the control circuit, registered memory address and control signals for the normal memory read or write operation; propagating, by each respective data handler of the data module, respective read data signals or respective write data signals associated with the normal memory read or write operation between a respective n-bit-wide segment of the memory devices and a respective n-bit-wide segment of the system memory bus; and outputting or receiving, by at least one memory device in the respective n-bit-wide segment of the memory devices, the respective read data signals or the respective write data signals in response to the registered memory address and control signals; and performing testing operations, including: outputting, from the control circuit, test address and control signals; isolating, at the each respective data handler of the data module, respective data paths from the memory controller to the respective n-bit-wide segment of the memory devices; outputting, from the each respective data handler of the data module, respective test data signals to the respective segment of the memory devices based on information received from the control circuit; receiving, by one or more memory devices in the respective segment of the memory devices, test data included in the respective test data signals in response to the test address and control signals from the control circuit.

12. The method of claim 11, further comprising, during the testing operations:
   outputting, from the control circuit, verification address and control signals;
   outputting, from the one or more memory devices, respective verification data signals in response to the verification address and control signals; and
   receiving, at the each respective data handler of the data module, the respective verification data signals;
   comparing, at the each respective data handler of the data module, respective verification data in the respective verification data signals with expected data; and
   outputting, from the each respective data handler of the data module, comparison results.

13. The method of claim 12, wherein the expected data are stored in the each respective data handler.

14. The method of claim 12, wherein n=8 and N=64 or 72, wherein each memory device is a 4-bit-wide or 8-bit-wide dynamic random access memory device, and wherein the at least one memory device includes two respective 4-bit-wide memory devices or one respective 8-bit-wide memory device in one of the one or more ranks.

15. The method of claim 12, wherein outputting respective test data signals includes generating, by the each respective data handler of the data module, test data signals with programmable slew rates and peak values so that characteristics of the respective test data signals correspond to characteristics of the respective write data signals from the memory controller.

16. The method of claim 11, wherein the data module includes first and second data handlers in first and second integrated circuit packages, respectively, the method further comprising:
   during the normal memory read or write operation, propagating, by the first integrated circuit package, first data signals between a first n-bit-wide portion of the memory devices and a first n-bit-wide segment of the system memory bus, and propagating, by the second integrated circuit package, second data signals between a second n-bit-wide portion of the memory devices and a second n-bit-wide segment of the system memory bus independently of and concurrently with the first integrated circuit package propagating the first data signals; and during testing of the memory module, outputting, by the first integrated circuit package, first test data signal including first test data, and outputting, by the second integrated circuit package, second test data signals including second test data independently of and concurrently with the first integrated circuit package outputting the first test data signals, the first data being written into at least one first memory device, the second data being written into at least one second memory device.

17. The method of claim 11, wherein the memory module is operable at an operational speed according to a system clock, wherein the respective data signals is output or received by the at least one respective memory device at the operational speed in response to the registered memory address and control signals, and wherein the respective test data signals is output by the each respective data handler at the operational speed in response to a write command from the control circuit.

18. A memory module operable in a computer system including a system memory controller coupled to a system memory bus having a bit width N, where N is a positive integer, the memory module comprising:
   a printed circuit board (PCB) including a connector that fits into a corresponding slot connector of the computer system whereby the memory module is operatively coupled to the system memory controller of the computer system via the system memory bus;
   memory devices mounted on the PCB and organized in one or more N-bit-wide ranks, the memory devices having address and control ports and data ports;
   a data module coupled between the data ports of the memory devices and the connector, the data module including a plurality of data handlers in respective physically separate integrated circuit packages mounted on respective portions of the PCB and coupled to respective n-bit-wide segments of the memory devices, where n is a positive integer smaller than N; and
   a control circuit mounted on the PCB and coupled to the connector, the data module, and address and control ports of the memory devices;
   wherein, during a normal memory read or write operation, the control circuit is configurable to receive system address and control signals from the system memory controller via the connector and to output registered memory address and control signals for the normal memory read or write operation, and each respective data handler of the data module is configurable to propagate respective read or write data signals associated with the normal memory read or write operation between a respective n-bit-wide segment of the memory devices and a respective n-bit-wide segment of the system memory bus, the respective read or write data signals being output or received by at least one memory device in the respective n-bit-wide segment of the memory devices in response to the registered memory address and control signals; and
   wherein, during testing of the memory module, the control circuit is configurable to output test address and control signals to the memory devices and a command to the data module, the data module is configurable to isolate data paths from the memory controller to the memory devices through the data handlers, the each respective data handler of the data module is configurable to output respective test data signals to the respective segment of the memory devices in response to the command from the control module, and the respective test data signals including test data to be received by and written into one or more memory devices in the respective segment of the memory devices in response to the test address and control signals from the control circuit.

19. The memory module of claim 18, wherein, during testing of the memory module:

the control circuit is configurable to output verification address and control signals;

the one or more memory devices are configurable to output respective verification data signals in response to the verification address and control signals; and the each respective data handler of the data module is configurable to receive the respective verification data signals, to compare respective verification data in the respective verification data signals with expected data, and to output comparison results.

20. The memory module of claim 19, wherein the expected data are stored in the each respective data handler.

21. The memory module of claim 19, wherein n=8 and N=64 or 72, wherein each memory device is a 4-bit-wide or 8-bit-wide dynamic random access memory device, and wherein the at least one memory device includes two respective 4-bit-wide memory devices or one respective 8-bit-wide memory device in one of the one or more ranks.

22. The memory module of claim 18, wherein the each respective data handler of the data module is configurable to generate the respective test data signals with programmable slew rates and peak values so that characteristics of the respective test data signals correspond to characteristics of the respective write data signals from the memory controller.

23. The memory module of claim 22, wherein the data module includes first and second data handlers in first and second integrated circuit packages, respectively, and wherein:

during the normal memory read or write operation, the first integrated circuit package is configurable to propagate first data signals between a first n-bit-wide portion of the memory devices and a first n-bit-wide segment of the system memory bus, and the second integrated circuit package is configurable to propagate second data signals between a second n-bit-wide portion of the memory devices and a second n-bit-wide segment of the system memory bus independently of and concurrently with the first integrated circuit package propagating the first data signals; and during testing of the memory module, the first integrated circuit package is configurable to write first test data into at least one first memory device by outputting first test data signals, and the second integrated circuit package is configurable to write second test data into at least one second memory device by outputting second test data signals independently of and concurrently with the first integrated circuit package outputting the first test data signals.

24. The memory module of claim 22, wherein the memory module is operable at an operational speed according to a system clock, wherein the at least one respective memory device is configurable to output or receive the respective read or write data signals at the operational speed in response to the registered memory address and control signals, and wherein the each respective data handler is configurable to output the respective test data signals at the operational speed in response to the write command from the control circuit.

\* \* \* \* \*